(12) United States Patent
Yamazaki et al.

(10) Patent No.: US 7,316,947 B2
(45) Date of Patent: *Jan. 8, 2008

(54) METHOD OF MANUFACTURING A SEMICONDUCTOR DEVICE

(75) Inventors: Shunpei Yamazaki, Atsugi (JP); Osamu Nakamura, Atsugi (JP); Masayuki Kajiwara, Atsugi (JP); Junichi Koezuka, Atsugi (JP); Koji Dairiki, Atsugi (JP); Toru Mitsuki, Atsugi (JP); Toru Takayama, Atsugi (JP); Hideto Ohnuma, Atsugi (JP); Taketomi Asami, Atsugi (JP); Mitsuhiro Ichijo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 4 days.

This patent is subject to a terminal disclaimer.

(21) Appl. No.: 10/072,931

(22) Filed: Feb. 12, 2002

(65) Prior Publication Data

US 2002/0151120 A1 Oct. 17, 2002

(30) Foreign Application Priority Data

Feb. 16, 2001 (JP) ............................. 2001-040837

(51) Int. Cl.
*H01L 21/00* (2006.01)

(52) U.S. Cl. ............... 438/166; 438/476; 257/E21.318; 257/E21.561

(58) Field of Classification Search ................ 438/143, 438/149, 310, 311, 471, 482, 488, 761–765, 438/778, 166, 486, 476; 257/E21.561, E21.318
See application file for complete search history.

(56) References Cited

U.S. PATENT DOCUMENTS 3,535,775 A 10/1970 Garfinkel et al.

(Continued)

FOREIGN PATENT DOCUMENTS

EP 0 651 431 A2 5/1995

(Continued)

OTHER PUBLICATIONS

Jones, K. S. ; Kuryliw, E.; Murto, R.; Rendon, M.; Talwar, S.; Boron Diffusion upon Annealing of Laser Thermal processed silicon, Ion Implantation Technology, 2000, Conference on, 2000, pp. 111-114.*

(Continued)

*Primary Examiner*—Michael Lebentritt
*Assistant Examiner*—Stanetta Isaac
(74) *Attorney, Agent, or Firm*—Eric J. Robinson; Robinson Intellectual Property Law Office, P.C.

(57) ABSTRACT

An object is to reduce the number of high temperature (equal to or greater than 600° C.) heat treatment process steps and achieve lower temperature (equal to or less than 600° C.) processes, and to simplify the process steps and increase throughput in a method of manufacturing a semiconductor device. With the present invention, a barrier layer, a second semiconductor film, and a third semiconductor film containing a noble (rare) gas element are formed on a first semiconductor film having a crystalline structure. Gettering is performed and a metallic element contained in the first semiconductor film passes through the barrier layer and the second semiconductor film by a heat treatment process, and moves to the third semiconductor film. The second semiconductor film and the third semiconductor film are then removed, with the barrier layer used as an etching stopper.

39 Claims, 16 Drawing Sheets

U.S. PATENT DOCUMENTS

| | | | | |
|---|---|---|---|---|
| 4,371,403 | A | 2/1983 | Ikubo et al. | |
| 4,477,308 | A | 10/1984 | Gibson et al. | |
| 4,534,820 | A | 8/1985 | Mori et al. | |
| 4,608,096 | A * | 8/1986 | Hill | 148/33 |
| 5,229,305 | A * | 7/1993 | Baker | 438/459 |
| 5,244,819 | A | 9/1993 | Yue | |
| 5,275,896 | A | 1/1994 | Garofalo et al. | |
| 5,403,772 | A | 4/1995 | Zhang et al. | |
| 5,426,064 | A | 6/1995 | Zhang et al. | |
| 5,481,121 | A | 1/1996 | Zhang et al. | |
| 5,488,000 | A | 1/1996 | Zhang et al. | |
| 5,492,843 | A | 2/1996 | Adachi et al. | |
| 5,501,989 | A | 3/1996 | Takayama et al. | |
| 5,508,533 | A | 4/1996 | Takemura | |
| 5,529,937 | A | 6/1996 | Zhang et al. | |
| 5,534,716 | A | 7/1996 | Takemura | |
| 5,543,352 | A | 8/1996 | Ohtani et al. | |
| 5,563,426 | A | 10/1996 | Zhang et al. | |
| 5,569,610 | A | 10/1996 | Zhang et al. | |
| 5,569,936 | A | 10/1996 | Zhang et al. | |
| 5,580,792 | A | 12/1996 | Zhang et al. | |
| 5,585,291 | A * | 12/1996 | Ohtani et al. | |
| 5,589,694 | A | 12/1996 | Takayama et al. | |
| 5,595,923 | A | 1/1997 | Zhang et al. | |
| 5,595,944 | A | 1/1997 | Zhang et al. | |
| 5,604,360 | A | 2/1997 | Zhang et al. | |
| 5,605,846 | A | 2/1997 | Ohtani et al. | |
| 5,606,179 | A | 2/1997 | Yamazaki et al. | |
| 5,608,232 | A | 3/1997 | Yamazaki et al. | |
| 5,612,250 | A | 3/1997 | Ohtani et al. | |
| 5,614,426 | A | 3/1997 | Funada et al. | |
| 5,614,733 | A | 3/1997 | Zhang et al. | |
| 5,616,506 | A | 4/1997 | Takemura | |
| 5,620,910 | A | 4/1997 | Teramoto | |
| 5,621,224 | A | 4/1997 | Yamazaki et al. | |
| 5,624,851 | A | 4/1997 | Takayama et al. | |
| 5,637,515 | A | 6/1997 | Takemura | |
| 5,639,698 | A | 6/1997 | Yamazaki et al. | |
| 5,643,826 | A | 7/1997 | Ohtani et al. | |
| 5,646,424 | A | 7/1997 | Zhang et al. | |
| 5,654,203 | A | 8/1997 | Ohtani et al. | |
| 5,656,825 | A | 8/1997 | Kusumoto et al. | |
| 5,663,077 | A | 9/1997 | Adachi et al. | |
| 5,677,549 | A | 10/1997 | Takayama et al. | |
| 5,696,386 | A | 12/1997 | Yamazaki | |
| 5,696,388 | A | 12/1997 | Funada et al. | |
| 5,700,333 | A | 12/1997 | Yamazaki et al. | |
| 5,705,829 | A | 1/1998 | Miyanaga et al. | |
| 5,712,191 | A | 1/1998 | Nakajima et al. | |
| 5,714,395 | A * | 2/1998 | Bruel | 438/528 |
| 5,744,824 | A | 4/1998 | Kousai et al. | |
| 5,773,327 | A | 6/1998 | Yamazaki et al. | |
| 5,789,284 | A * | 8/1998 | Yamazaki et al. | |
| 5,814,540 | A | 9/1998 | Takemura et al. | |
| 5,843,225 | A | 12/1998 | Takayama et al. | |
| 5,869,363 | A | 2/1999 | Yamazaki et al. | |
| 5,888,858 | A | 3/1999 | Yamazaki et al. | |
| 5,893,730 | A | 4/1999 | Yamazaki et al. | |
| 5,897,347 | A | 4/1999 | Yamazaki et al. | |
| 5,915,174 | A | 6/1999 | Yamazaki et al. | |
| 5,923,962 | A | 7/1999 | Ohtani et al. | |
| 5,932,893 | A | 8/1999 | Miyanaga et al. | |
| 5,949,115 | A | 9/1999 | Yamazaki et al. | |
| 5,956,579 | A | 9/1999 | Yamazaki et al. | |
| 5,960,252 | A * | 9/1999 | Matsuki et al. | 438/3 |
| 5,961,743 | A | 10/1999 | Yamazaki et al. | |
| 5,977,559 | A | 11/1999 | Zhang et al. | |
| 5,985,740 | A | 11/1999 | Yamazaki et al. | |
| 6,022,458 | A | 2/2000 | Ichikawa | |
| 6,027,987 | A | 2/2000 | Yamazaki et al. | |
| 6,048,758 | A * | 4/2000 | Yamazaki et al. | 438/166 |
| 6,063,654 | A | 5/2000 | Ohtani | |
| 6,066,518 | A | 5/2000 | Yamazaki | |
| 6,071,764 | A | 6/2000 | Zhang et al. | |
| 6,071,766 | A | 6/2000 | Yamazaki et al. | |
| 6,072,193 | A | 6/2000 | Ohnuma et al. | |
| 6,077,731 | A | 6/2000 | Yamazaki et al. | |
| 6,077,758 | A | 6/2000 | Zhang et al. | |
| 6,083,324 | A * | 7/2000 | Henley et al. | |
| 6,084,247 | A | 7/2000 | Yamazaki et al. | |
| 6,087,679 | A | 7/2000 | Yamazaki et al. | |
| 6,093,934 | A | 7/2000 | Yamazaki et al. | |
| 6,100,562 | A | 8/2000 | Yamazaki et al. | |
| 6,111,557 | A | 8/2000 | Koyama et al. | |
| 6,121,660 | A | 9/2000 | Yamazaki et al. | |
| 6,133,073 | A | 10/2000 | Yamazaki et al. | |
| 6,133,075 | A | 10/2000 | Yamazaki et al. | |
| 6,133,119 | A | 10/2000 | Yamazaki | |
| 6,153,445 | A | 11/2000 | Yamazaki et al. | |
| 6,156,590 | A | 12/2000 | Yamazaki et al. | |
| 6,156,628 | A | 12/2000 | Ohnuma et al. | |
| 6,160,268 | A | 12/2000 | Yamazaki | |
| 6,162,704 | A | 12/2000 | Yamazaki et al. | |
| 6,165,824 | A | 12/2000 | Takano et al. | |
| 6,168,980 | B1 | 1/2001 | Yamazaki et al. | |
| 6,180,439 | B1 | 1/2001 | Yamazaki et al. | |
| 6,184,559 | B1 | 2/2001 | Hayakawa et al. | |
| 6,194,255 | B1 | 2/2001 | Hiroki et al. | |
| 6,197,624 | B1 | 3/2001 | Yamazaki | |
| 6,201,585 | B1 | 3/2001 | Takano et al. | |
| 6,204,101 | B1 | 3/2001 | Yamazaki et al. | |
| 6,204,154 | B1 | 3/2001 | Zhang et al. | |
| 6,207,969 | B1 | 3/2001 | Yamazaki | |
| 6,218,219 | B1 | 4/2001 | Yamazaki et al. | |
| 6,225,152 | B1 | 5/2001 | Yamazaki et al. | |
| 6,232,205 | B1 | 5/2001 | Ohtani | |
| 6,232,621 | B1 | 5/2001 | Yamazaki et al. | |
| 6,242,290 | B1 | 6/2001 | Nakajima et al. | |
| 6,251,712 | B1 | 6/2001 | Tanaka et al. | |
| 6,255,195 | B1 * | 7/2001 | Linn et al. | |
| 6,285,042 | B1 | 9/2001 | Ohtani et al. | |
| 6,287,900 | B1 | 9/2001 | Yamazaki et al. | |
| 6,291,275 | B1 | 9/2001 | Yamazaki et al. | |
| 6,291,888 | B1 * | 9/2001 | Bhat et al. | 257/758 |
| 6,294,441 | B1 | 9/2001 | Yamazaki | |
| 6,300,659 | B1 | 10/2001 | Zhang et al. | |
| 6,303,415 | B1 | 10/2001 | Yamazaki | |
| 6,303,963 | B1 | 10/2001 | Ohtani et al. | |
| 6,307,214 | B1 | 10/2001 | Ohtani et al. | |
| 6,316,789 | B1 | 11/2001 | Yamazaki et al. | |
| 6,316,810 | B1 | 11/2001 | Yamazaki et al. | |
| 6,331,457 | B1 | 12/2001 | Yamazaki et al. | |
| 6,337,259 | B1 * | 1/2002 | Ueda et al. | |
| 6,376,336 | B1 * | 4/2002 | Buynoski | |
| 6,396,147 | B1 * | 5/2002 | Adachi et al. | |
| 6,399,454 | B1 | 6/2002 | Yamazaki | |
| 6,436,745 | B1 * | 8/2002 | Gotou et al. | |
| 6,451,672 | B1 * | 9/2002 | Caruso et al. | 438/471 |
| 6,489,189 | B2 | 12/2002 | Yamazaki et al. | |
| RE38,266 | E | 10/2003 | Yamazaki et al. | |
| 6,670,259 | B1 * | 12/2003 | Chan | 438/473 |
| 6,686,262 | B2 | 2/2004 | Yamazaki et al. | |
| 6,803,296 | B2 * | 10/2004 | Miyairi | 438/486 |
| 6,808,968 | B2 * | 10/2004 | Yamazaki et al. | 438/166 |
| 6,812,081 | B2 | 11/2004 | Yamazaki et al. | |
| 6,821,827 | B2 * | 11/2004 | Nakamura et al. | 438/166 |
| 6,821,828 | B2 * | 11/2004 | Ichijo et al. | 438/166 |
| 6,913,956 | B2 | 7/2005 | Hamada et al. | |
| 6,962,837 | B2 | 11/2005 | Yamazaki | |
| 6,991,976 | B2 | 1/2006 | Yamazaki et al. | |
| 7,052,943 | B2 * | 5/2006 | Yamazaki et al. | 438/166 |
| 7,109,074 | B2 | 9/2006 | Ichijo et al. | |
| 7,115,453 | B2 | 10/2006 | Nakamura et al. | |
| 7,129,120 | B2 | 10/2006 | Yamazaki | |

| | | | |
|---|---|---|---|
| 2001/0034088 | A1 | 10/2001 | Nakamura et al. |
| 2002/0086469 | A1* | 7/2002 | Kim et al. |
| 2002/0106861 | A1 | 8/2002 | Yamazaki |

FOREIGN PATENT DOCUMENTS

| | | |
|---|---|---|
| JP | 05-109737 | 4/1993 |
| JP | 07-130652 | 5/1995 |
| JP | 07-183540 | 7/1995 |
| JP | 08-078329 | 3/1996 |
| JP | 09-074207 | 3/1997 |
| JP | 09-115831 | 5/1997 |
| JP | 3032801 | 2/2000 |
| JP | 3032801 | 4/2000 |
| JP | 2000-260777 | 9/2000 |
| JP | 2001-210828 | 8/2001 |

OTHER PUBLICATIONS

Lurng Shehng Lee; Chung Len Lee, Argon Ion-Implantation on Polysilicon or Amorphous-silicon for Bor penetration Suppression in p/sup+/pMOSFET, Electron Devices, IEEE Transactions on, vol. 45 Issue: 8, Aug. 1998, pp. 1737-1744.*

Llewellyn, D. J.; Ridgway, M. C.; Davis, M.; Rolfe, S. J.,Implantation and Annealling of Cu in InP of Electrical Isolation: Microstructural Characterisation,Optoelectronic and Microelectronic Materials and Devices Proceedings, 1996, pp. 313-316.*

Miyake, M.; Okazaki, Y>; Kobayashi, T.; Charcteristics of Buried-Channel pMOS Devices with Shallow Count layers Fabricated using Channel Preamorphization, Electron Devices, IEEE Transactions on, vol. 43 Issue: Mar. 1996, pp. 444-449.*

U.S. Appl. No. 10/051,064, "Semiconductor Device and Method of Manufacturing the Same", Takashi Hamada et al., Jan. 18, 2002.

U.S. Appl. No. 10/056,055, including specification, drawings and filing receipt, "Semiconductor Device and Manufacturing Method of the Same", Osamu Nakamura et al., Jan. 28, 2002.

U.S. Appl. No. 10/097,641, including specification, drawings and filing receipt, "Method of Manufacturing a Semiconductor Device", Shunpei Yamazaki et al., Mar. 15, 2002.

U.S. Appl. No. 10/074,050, including specification, drawings and filing receipt, "Method of Manufacturing a Semiconductor Device", Shunpei Yamazaki et al., Feb. 14, 2002.

U.S. Appl. No. 10/020,961, including specification, drawings and filing receipt, "Method of Manufacturing Semiconductor Device and Semiconductor Device", Shunpei Yamazaki et al., Dec. 19, 2001.

U.S. Appl. No. 10/066,542, including specification, drawings and filing receipt, "Semiconductor Device and Method for Manufacturing the Same", Osamu Nakamura et al., Feb. 5, 2002.

* cited by examiner

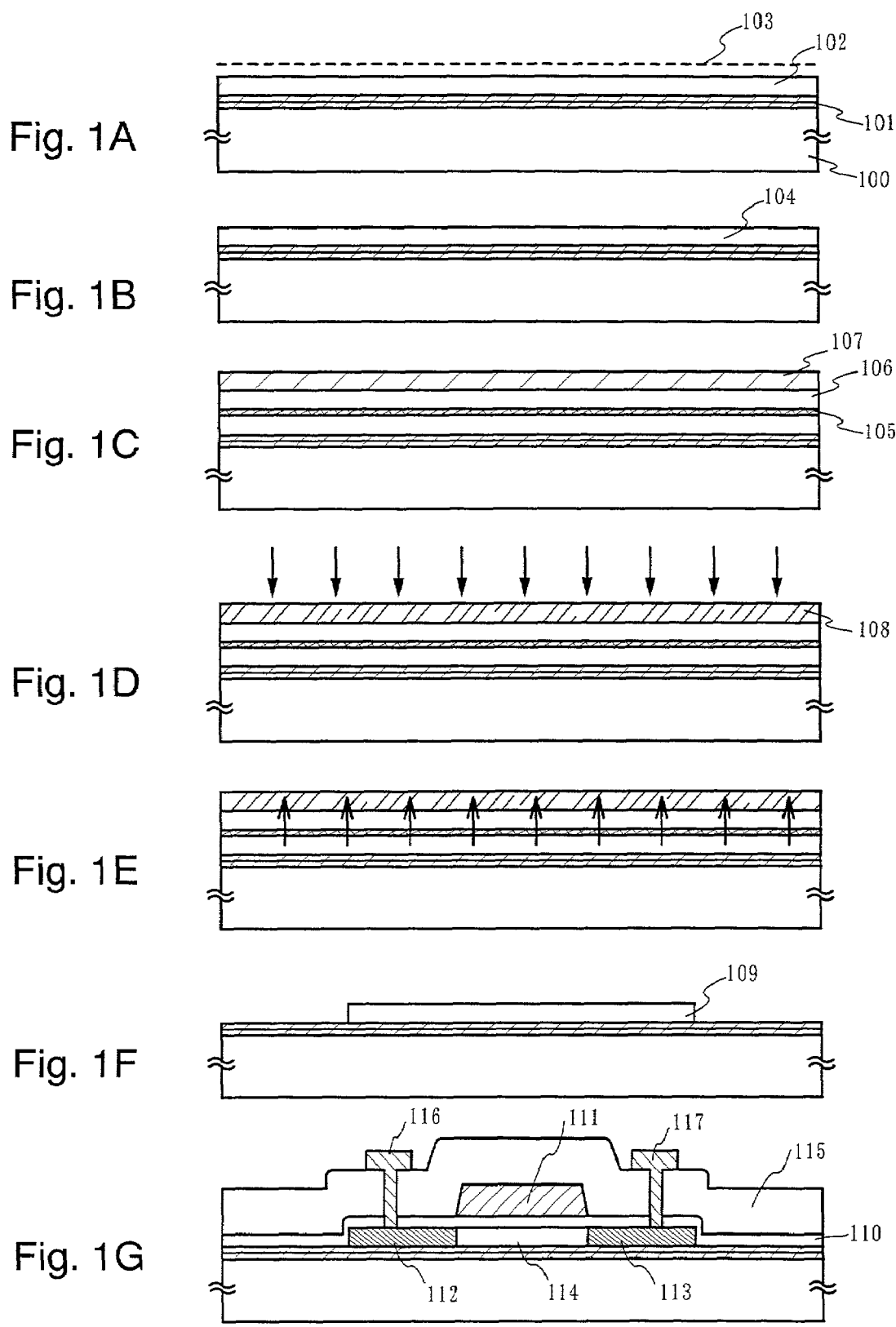

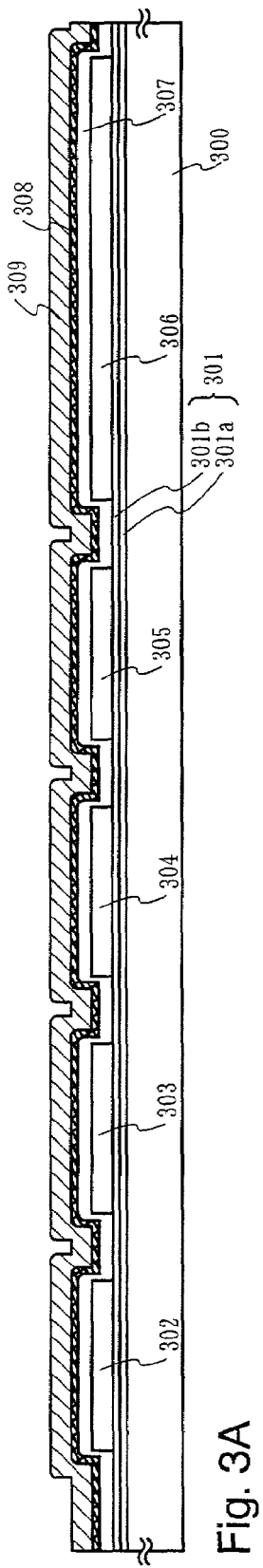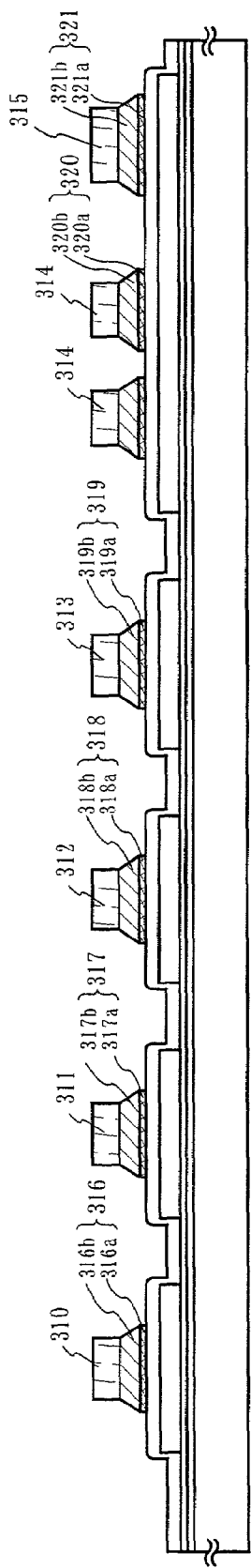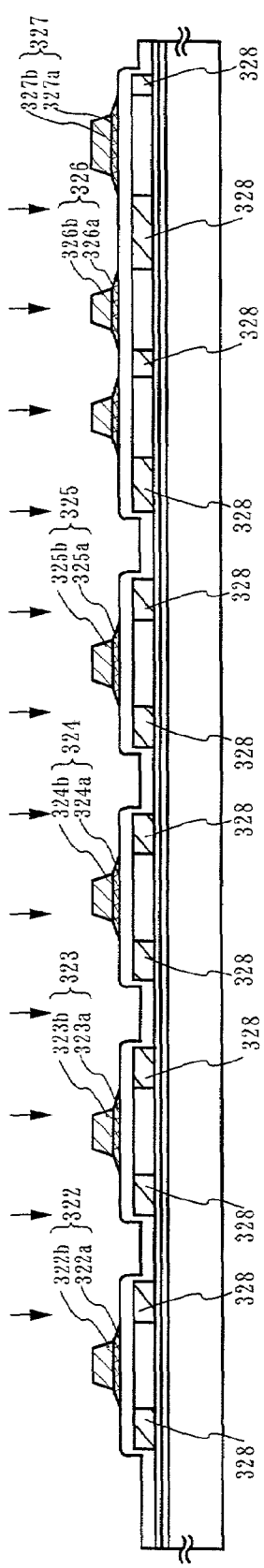

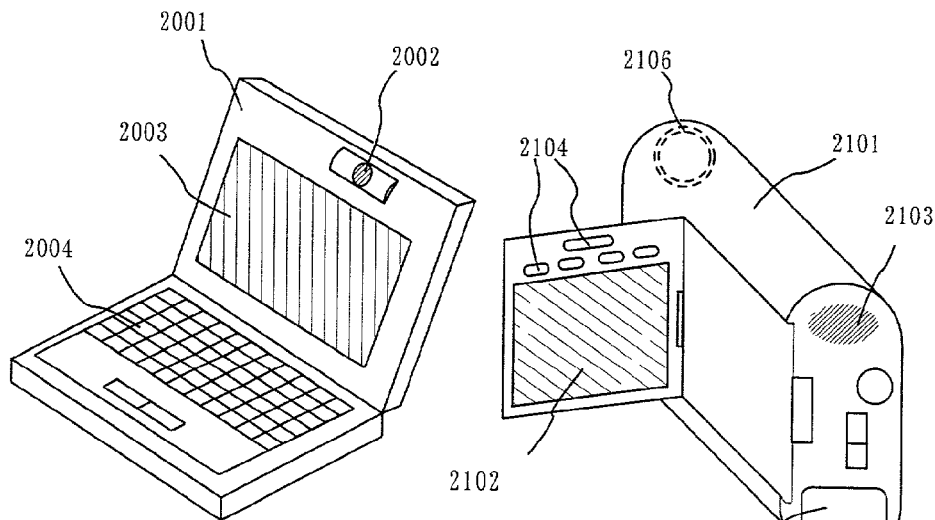
Fig. 13A
Fig. 13B
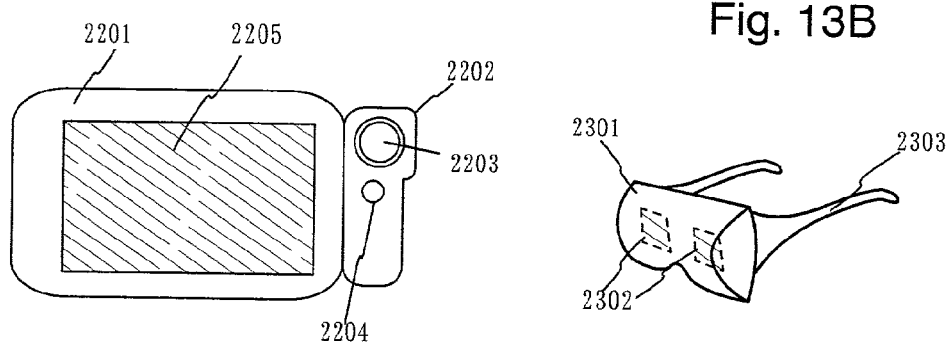
Fig. 13C
Fig. 13D
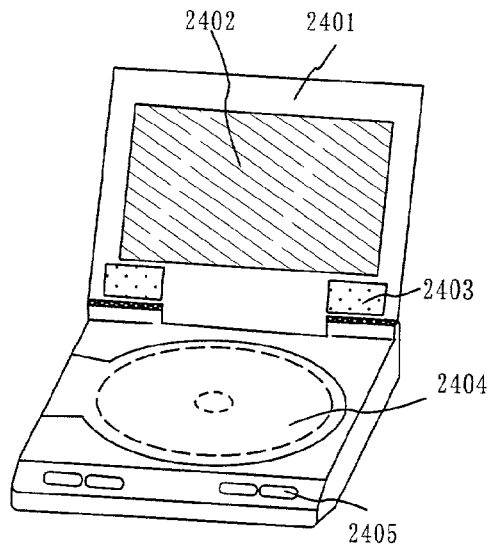
Fig. 13E
Fig. 13F

METHOD OF MANUFACTURING A SEMICONDUCTOR DEVICE

BACKGROUND OF THE INVENTION

1. Field of the Invention

The present invention relates to a method of manufacturing a semiconductor device using a gettering technique. In particular, the present invention relates to a method of manufacturing a semiconductor device that uses a crystalline semiconductor film manufactured by adding a metallic element having a catalytic action in crystallizing a semiconductor film.

Note that, throughout this specification, the term semiconductor device indicates general devices capable of functioning by utilizing semiconductor properties. Electro-optical devices, semiconductor circuits, and electronic devices are all semiconductor devices.

2. Description of the Related Art

Thin film transistors (hereafter referred to as TFTs) are known as typical semiconductor elements that use a semiconductor film having a crystalline structure (hereafter referred to as crystalline semiconductor film). TFTs are in the spotlight as a technique of forming an integrated circuit on an insulating substrate such as glass, and devices such as liquid crystal display devices having integrated driver circuits are being put into practical use. In conventional techniques, crystalline semiconductor films are manufactured from an amorphous semiconductor film deposited by plasma CVD or reduced pressure CVD by using a heat treatment process or a laser annealing method (a technique in which a semiconductor film is crystallized by irradiation of laser light).

A crystalline semiconductor film thus manufactured is an aggregate of a plurality of crystal grains, and its crystal orientation is arranged in arbitrary directions. It is impossible to control the crystal orientation, and this consequently causes limitations in properties of the TFT. In solving this problem, Japanese Patent Application Laid-open No. Hei 7-183540 discloses a technique in which a metallic element having a catalytic action with respect to semiconductor film crystallization, such as nickel, is added and a crystalline semiconductor film is then manufactured. This not only has an effect of lowering a heating temperature required for crystallization, but it also becomes possible to increase the crystal orientation arrangement to become more unidirectional. If a TFT is formed by using this type of crystalline semiconductor film, then not only does it become possible to increase the electric field effect mobility, but a subthreshold coefficient (S value) also becomes smaller, and electrical properties increase significantly.

However, if a metallic element having a catalytic action for crystallization is added, the metallic element remains within the crystalline semiconductor film or on the surface of the film, and there are problems such as fluctuation in properties of elements obtained. Examples thereof include problems such as an increase in an off current in the TFT and its fluctuation between the individual elements. That is, the metallic elements that have a catalytic action for crystallization exist unnecessarily after the crystalline semiconductor film is formed.

Gettering using phosphorous is an effective and often used method for removing this type of metallic element from specified regions of the crystalline semiconductor film. For example, it is possible to easily remove the metallic elements from a channel forming region by performing a heat treatment process at a temperature of 450 to 700° C. by adding phosphorous to a source or drain region of the TFT.

Phosphorous is injected into the crystalline semiconductor film by an ion doping method (this indicates a method of dissociating $PH_3$ or the like by a plasma, accelerating of the ions by using an electric field, and injecting the ions into the semiconductor film; the ion doping method is basically a method in which separation of mass of ions is not performed). The concentration of phosphorous necessary for gettering is equal to or greater than $1 \times 10^{20}/cm^3$. Adding phosphorous by ion doping can cause a crystalline semiconductor film to take on amorphous qualities, and the increase in the phosphorous concentration hinders recrystallization during a later annealing process, thus becoming a problem. Further, the addition of a high concentration of phosphorous causes an increase in the required amount of processing time for doping, and throughput of the doping process step is decreased, thus becoming a problem.

SUMMARY OF THE INVENTION

An object of the present invention is to reduce the number of high temperature (greater than 600° C.) heat treatment process steps and achieve further lower temperature (equal to or less than 600° C.) processes, and to simplify the process steps and to increase throughput in a method of manufacturing a semiconductor device.

The present invention has: a step of forming a first semiconductor film having a crystalline structure by using a metallic element; a step of forming a film that becomes an etching stopper (barrier layer); a step of forming a second semiconductor film; a step of forming a third semiconductor film containing a noble (rare) gas element (gettering sites); a step of gettering the metallic element to the gettering sites; and a step of removing the second semiconductor film and the third semiconductor film.

Further, in the step of forming the third semiconductor film containing the noble (rare) gas element (gettering sites), the noble (rare) gas element may also be added to the semiconductor film after forming the semiconductor film having an amorphous structure or a crystalline structure. Ion doping or ion injection may be used as a method for adding the noble (rare) gas elements. Note that film formation conditions are regulated so that film peeling does not develop.

One element, or a plurality of elements, selected from the group consisting of H, $H_2$, $O_1$, $O_2$ and P may also be added in addition to the noble (rare) gas element. A synergistic gettering effect can be obtained by thus adding a plurality of elements. Among the group, O and $O_2$ are particularly effective, and gettering efficiency is increased if oxygen concentration added during or after film formation is equal to or greater than $5 \times 10^{18}/cm^3$ within the second semiconductor film and the third semiconductor film as measured by SIMS analysis, preferably in a concentration range from $1 \times 10^{19}/cm^3$ to $1 \times 10^{22}/cm^3$. Note that inert gas elements have almost no diffusion. If another element added in addition to the noble (rare) gas element diffuses easily, then it is preferable to regulate the film thickness of the second semiconductor film such that the other added element does not diffuse to the first semiconductor film due to later heat treatment processes. Furthermore, in addition to the second semiconductor film, the barrier layer also functions to prevent diffusion of the other element.

The step of forming the third semiconductor film containing the noble (rare) gas element (gettering sites) may also be performed by employing plasma CVD or reduced pressure thermal CVD using a raw material gas containing the noble (rare) gas element. However, the film formation conditions are regulated so that film peeling does not develop.

Experimental results are shown below in Table 1 for measurements of an internal stress within amorphous silicon films (samples A to L) having a film thickness of 2000 Å and formed by using silane gas (SiH$_4$, 100 sccm) as a film formation gas (flow rate) and changing the flow rate of an argon gas between 0 sccm, 100 sccm, 200 sccm, 300 sccm, 400 sccm, and 500 sccm.

TABLE 1

Film formation conditions: SiH$_4$ = 100, Ar = 0 to 500, 0.25 Torr, Gap 35 mm, RF power 35 W (continuous oscillation)

| Sample No. | Ar flow rate [sccm] | Film thickness [Å] | Stress [dyn/cm2] | Stress direction |
|---|---|---|---|---|
| A | 0 | 1935 | 1.12E + 09 | tensile |
| B | 0 | 1935 | 1.13E+09 | tensile |
| C | 100 | 2022 | 1.68E+09 | tensile |
| D | 100 | 2022 | 1.31E+09 | tensile |
| E | 200 | 1992 | 1.18E+09 | tensile |
| F | 200 | 1992 | 1.18E+09 | tensile |
| G | 300 | 1973 | 1.55E+09 | tensile |
| H | 300 | 1973 | 1.36E+09 | tensile |
| I | 400 | 1917 | 1.34E+09 | tensile |
| J | 400 | 1917 | 1.37E+09 | tensile |
| K | 500 | 1945 | 1.31E+09 | tensile |
| L | 500 | 1945 | 1.34E+09 | tensile |

Further, a graph of Table 1 is shown in FIG. 16, and a comparative example of an amorphous silicon film with pulse oscillation is also shown. A compressive stress (approximately $9.7 \times 10^9$ dynes/cm$^2$) is shown for the amorphous silicon film formed by using RF pulse oscillation, and therefore there is a concern that film peeling will develop. Consequently, it is preferable to form films by using continuous oscillation RF at the conditions showing tensile stresses (1.12 to $1.68 \times 10^9$ dynes/cm$^2$) of Table 1. The second semiconductor film that does not contain the noble (rare) gas element may be formed by conditions of the sample A or B, and it is preferable to form the third semiconductor film that contains the noble (rare) gas element by using one set of conditions from among those of samples C to L.

Note that the amorphous silicon films used in the aforementioned experiment and formed by plasma CVD (PCVD apparatus) are formed at an RF power of 35 W and a film formation pressure of 0.25 Torr.

In general, internal stresses are either tensile stresses or compressive stresses. When a thin film tries to contract with respect to a substrate, the substrate pulls in a direction so as to prevent the contraction, the thin film changes shape to the inside. This is referred to as a tensile stress. If the thin film tries to expand, then the substrate pushes back and the thin film changes shape to the outside. This is referred to as a compressive stress.

The third semiconductor film containing the noble (rare) gas element may also be formed by sputtering. The noble (rare) gas element may additionally be added at the film formation stage after obtaining the third semiconductor film containing the noble (rare) gas to increase the gettering efficiency.

One structure of the present invention disclosed by this specification is a method of manufacturing a semiconductor device, having:

a first step of adding a metallic element to a first semiconductor film having an amorphous structure;

a second step of crystallizing the first semiconductor film, forming a first semiconductor film having a crystalline structure;

a third step of forming a barrier layer on a surface of the first semiconductor film having a crystalline structure;

a fourth step of forming a second semiconductor film on the barrier layer;

a fifth step of forming a third semiconductor film, containing a noble (rare) gas element at a concentration of $1 \times 10^{19}$ to $1 \times 10^{22}$/cm$^3$, on the second semiconductor film;

a sixth step of gettering the metallic element into the third semiconductor film, removing, or reducing the amount of, the metallic element within the first semiconductor film having a crystalline structure; and a seventh step of removing the second semiconductor film and the third semiconductor film.

In the above structure of the present invention, the fifth step may be made into: a step of forming a semiconductor film and a step of adding a noble (rare) gas element to the semiconductor film; or a step of forming a third semiconductor film containing a noble (rare) gas element by using plasma CVD or reduced pressure thermal CVD; or into a step of forming a third semiconductor film containing a noble (rare) gas by using sputtering.

Further, if the noble (rare) gas element is added in the above structure, it is preferable to also add one element, or a plurality of elements, chosen from the group consisting of O, O$_2$, P, H, and H$_2$ in addition to the noble (rare) gas.

The third semiconductor film in the above structure is a single layer, or a lamination structure, of a semiconductor film having an amorphous structure or a crystalline structure and formed by plasma CVD, reduced pressure CVD, or sputtering. Furthermore, it is preferable that the third semiconductor film have a tensile stress.

The present invention is not limited to the above structure, and gettering sites may also be formed by adding a noble (rare) gas element only on the upper layer of the second semiconductor film, without forming the third semiconductor film.

A second structure of the present invention is a method of manufacturing a semiconductor device, having:

a first step of adding a metallic element to a first semiconductor film having an amorphous structure;

a second step of crystallizing the first semiconductor film, forming a first semiconductor film having a crystalline structure;

a third step of forming a barrier layer on a surface of the first semiconductor film having a crystalline structure;

a fourth step of forming a second semiconductor film on the barrier layer;

a fifth step of adding a noble (rare) gas element at a concentration of $1 \times 10^{19}$ to $1 \times 10^{22}$/cm$^3$ to an upper layer of the second semiconductor film;

a sixth step of gettering the metallic element into the upper layer of the second semiconductor film, removing, or reducing the amount of, the metallic element within the first semiconductor film having a crystalline structure; and a seventh step of removing the second semiconductor film.

It is preferable to also add one element, or a plurality of elements, chosen from the group consisting of O, O$_2$, P, H, and H$_2$ in addition to the noble (rare) gas element in the fifth step of the above structure.

Furthermore, in both of the above structures, it is characterized in that the second semiconductor film is a single layer, or a lamination layer, of a semiconductor film having an amorphous structure or a crystalline structure and formed by plasma CVD, reduced pressure thermal CVD, or sputtering. Furthermore, it is preferable that the second semiconductor film have a tensile stress.

Further, it is characterized in that the metallic element in each of the above structures is an element, or a plurality of elements, chosen from the group consisting of Fe, Ni, Co, Ru, Rh, Pd, Os, Ir, Pt, Cu, and Au.

Further, it is characterized in that the second step in each of the above structures is a one process, or a combination of processes, chosen from a heat treatment process, a process of irradiating strong light, and a process of irradiating laser light (excimer laser light having a wavelength equal to or less than 400 nm, or the second harmonic or third harmonic of a YAG laser).

Further, the third step of forming the barrier layer in each of the above structures may be a step of oxidizing a surface of the semiconductor film having a crystalline structure by using a solution containing ozone, or a step of oxidizing the surface of the semiconductor film containing a crystalline structure by irradiating ultraviolet light under an oxygen atmosphere.

Further, it is characterized in that the sixth step in each of the above structures is a heat treatment process, a process of irradiating strong light to the semiconductor film having an amorphous structure, or a heat treatment and a process of irradiating strong light to the semiconductor film having an amorphous structure.

Further, in each of the above structures, if strong light is irradiated, then light emitted from a halogen lamp, a metal halide lamp, a xenon arc lamp, a carbon arc lamp, a high pressure sodium lamp, or a high pressure mercury lamp is used.

Further, it is characterized in that the noble (rare) gas element in each of the above structures is one element, or a plurality of elements, chosen from the group consisting of He, Ne, Ar, Kr, and Xe.

BRIEF DESCRIPTION OF THE DRAWINGS

In the accompanying drawings:

FIGS. 1A to 1G are diagrams showing a process of manufacturing a TFT;

FIGS. 3A to 3C are diagrams showing a process of manufacturing an active matrix substrate;

FIGS. 13A to 13F are diagrams showing examples of electronic equipment;

DETAILED DESCRIPTION OF THE PREFERRED EMBODIMENTS

Embodiment Modes

Figure 2A:
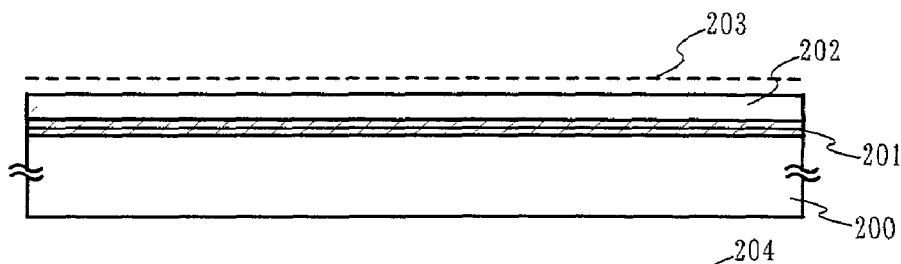
FIGS. 2A to 2G are diagrams showing a process of manufacturing a TFT.
Figure 2B:
Figure 2C:
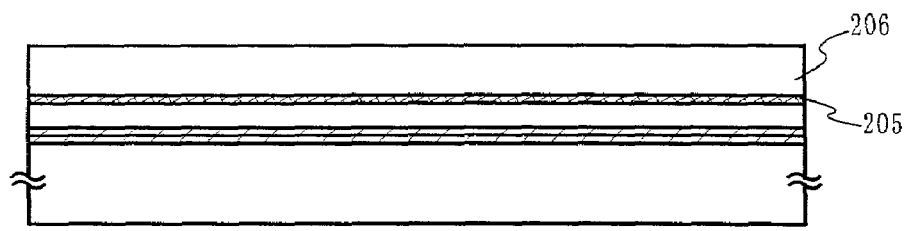

Embodiment modes of the present invention are explained below.

One aspect of the present invention has a process of forming a barrier layer and a semiconductor film on a crystalline semiconductor film, a process of forming a semiconductor film containing a noble (rare) gas element (gettering sites) on the crystalline semiconductor film, and a process of performing a heat treatment process. A metal contained in the crystalline semiconductor film moves due to the heat treatment process, and passes through the barrier layer and the semiconductor film (the semiconductor film that does not contain an ion of the noble (rare) gas element), and is captured in the gettering sites (the semiconductor film containing the ion of the noble (rare) gas element). The metallic element is thus removed from, or its amount is reduced in, the crystalline semiconductor film. Note that strong light may also be irradiated as a substitute for the heat treatment process, and that the irradiation of strong light may be performed at the same time as the heat treatment process.

Embodiment Mode 1

A typical manufacturing process is simply described below using FIGS. 1A to 1G.

Reference numeral 100 in FIG. 1A denotes a substrate having an insulating surface, reference numeral 101 denotes a base insulating film, and reference numeral 102 denotes a semiconductor film having an amorphous structure.

First, the base insulating film 101 made from an insulating film such as a silicon oxide film, a silicon nitride film, or a silicon oxynitride film is formed on the substrate 100 as a blocking layer. A two layer structure (a silicon oxynitride film having a film thickness of 50 nm and a silicon oxynitride film having a film thickness of 100 nm) is used here as the base insulating film 101, but a single layer film or a structure in which two or more layers are laminated may also be used. Note that the base insulating film may not necessarily be formed if it is unnecessary to form a blocking layer.

Next, the semiconductor film 102 having an amorphous structure on the base insulating film is crystallized by using a known means, forming a semiconductor film 104 having a crystalline structure. (See FIG. 1B.)

The semiconductor film having a crystalline structure may be formed by adding a metallic element to the semiconductor film 102 having an amorphous structure, which has been obtained by plasma CVD, reduced pressure thermal CVD, or sputtering, and next performing crystallization by a heat treatment process or irradiation of strong light. An amorphous silicon film is formed here, and a solution containing nickel is applied to the amorphous silicon film, forming a nickel containing layer 103.

After the crystallization, the segregated metallic element may be removed or reduced in its amount by using an etchant containing hydrofluoric acid, for example dilute hydrofluoric acid or FPM (a liquid mixture of hydrofluoric acid, hydrogen peroxide, and pure water). Further, it is preferable to irradiate strong light and perform leveling of the surface if the surface is etched using an etchant containing hydrofluoric acid.

Irradiation of laser light or strong light may also be performed after the crystallization in order to further improve the crystallization. The segregated metallic element may be removed or reduced in its amount by using an etchant containing hydrofluoric acid after the irradiation of laser light or strong light in order to improve the crystallization. In addition, strong light may also be irradiated for surface leveling.

Note that it is preferable that the semiconductor film 104 having a crystalline structure be formed such that oxygen concentration within the semiconductor film 104 is less than or equal to $5\times10^{18}/cm^3$ (SIMS analysis).

Next, a barrier layer 105 having silicon as its main constituent is formed on the semiconductor film 104 having a crystalline structure. Note that the barrier layer 105 may be extremely thin, and may also be a natural oxidation film. In addition, ozone may be generated by irradiating ultraviolet light under an atmosphere containing oxygen, forming an oxide film. Furthermore, an oxide film that is oxidized by using a solution containing ozone that is used in surface processing known as hydro washing, performed for removing carbon, namely organic matter, may also be used as the barrier layer 105. The barrier layer 105 is mainly used as an etching stopper. Channel doping may also be performed after forming the barrier layer 105, and then strong light may be irradiated to perform activation.

A second semiconductor film 106 is then formed on the barrier layer 105. The second semiconductor film 106 may be a semiconductor film having an amorphous structure, and it may also be a semiconductor film having a crystalline structure. The film thickness of the second semiconductor film 106 is set from 5 to 50 nm, preferably between 10 and 20 nm. It is preferable to include oxygen in the second semiconductor film 106 (at a concentration measured by SIMS analysis equal to or greater than $5\times10^{18}/cm^3$, preferably equal to or greater than $1\times10^{19}/cm^3$) to increase gettering efficiency.

A third semiconductor film 107 containing a noble (rare) gas element (gettering sites) is formed on the second semiconductor film 106. The third semiconductor film 107 may be formed by plasma CVD, reduced pressure thermal CVD, or by sputtering, and may have an amorphous structure or a crystalline structure. The third semiconductor film may be a semiconductor film containing a noble (rare) gas element at a film formation stage, or a noble (rare) gas element may be added after formation of a semiconductor film not containing a noble (rare) gas element. An example is shown in FIGS. 1A to 1G in which the third semiconductor film 107 is formed containing a noble (rare) gas element at the film formation stage, and then the noble (rare) gas element is additionally added selectively, forming a third semiconductor film 108. Furthermore, the second semiconductor film and the third semiconductor film may be formed in succession without exposure to the atmosphere. The sum of the film thickness of the second semiconductor film and the film thickness of the third semiconductor film may be from 30 to 200 nm, for example 50 nm.

A gap is opened between the first semiconductor film 104 and the third semiconductor film 108 (gettering sites) by the second semiconductor film 106 with the present invention. There is a tendency for the metallic elements to easily gather near the boundaries of the gettering sites during gettering, and therefore it is preferable to keep the boundaries of the gettering sites far away from the first semiconductor film 104 to increase gettering efficiency, by using the second semiconductor film 106 as in the present invention. In addition, the second semiconductor film 106 also is effective in blocking impurity elements contained in the gettering sites from diffusing during the gettering process and reaching an interface with the first semiconductor film. The second semiconductor film 106 also has a protective effect so that damage is not imparted to the first semiconductor film if inert gas elements are later added to the third semiconductor film.

Gettering is performed next. A heat treatment process is performed within a nitrogen atmosphere at 450 to 800° C. for 1 to 24 hours as a process for performing gettering, for example at 550° C. for 14 hours. Furthermore, strong light from a lamp light source may also be irradiated as a substitute to a heat treatment process using a furnace (including furnace annealing). Strong light may also be irradiated in addition to heat treatment. Nickel moves in the direction of an arrow in FIG. 1E due to the gettering, and the metallic element contained in the semiconductor film 104 covered with the barrier layer 105 is removed, or reduced in concentration. Note that annealing occurs at the same time as the heat treatment process here. Sufficient gettering is performed here so that nickel is not segregated in the first semiconductor film 104, but moves to the third semiconductor film 108 so that almost no nickel exists in the first semiconductor film 104. That is, the nickel concentration within the first semiconductor film is made less than or equal to $1\times10^{18}/cm^3$, preferably less than or equal to $1\times10^{17}/cm^3$.

Next, only the semiconductor films denoted by reference numerals 106 and 108 are selectively removed, with the barrier layer 105 acting as an etching stopper, and a semiconductor layer 109 is formed having a desired shape by using a known patterning technique on the semiconductor film 104.

After then cleaning the surface of the semiconductor layer using an etchant containing hydrofluoric acid, an insulating film having silicon as its main constituent is formed, becoming a gate insulating film 110. It is preferable to perform the surface cleaning and the formation of the gate insulating film in succession, without exposure to the atmosphere.

A gate electrode 111 is formed after cleaning the surface of the gate insulating film, and an impurity element that imparts n-type conductivity to a semiconductor (such as P or As) is suitably added, forming a source region 112 and a drain region 113. Phosphorous is used here. A heat treatment process, irradiation of strong light, or irradiation of laser light is then performed after the addition process in order to activate the impurity element. Furthermore, plasma damage to the gate insulating film, and plasma damage to the interface between the gate insulating film and to the semiconductor layer can be restored at the same time as activation is performed. In particular, it is extremely effective to perform activation of the impurity element by irradiating the second harmonic of a YAG laser from the top surface, or from the rear surface, in an atmosphere from a room temperature to 300° C. The use of a YAG laser is a preferable activation means because of its low maintenance.

Subsequent steps include: forming an interlayer insulating film 115, performing hydrogenation, forming contact holes reaching the source region and the drain region, and forming a source electrode 116 and a drain electrode 117, thereby completing a TFT.

The TFT thus obtained has, at least, nickel elements removed from a channel forming region 114, and also does not contain inert gas elements.

The present invention is not limited to the structure shown in FIGS. 1A to 1G. A low concentration drain (LDD, lightly doped drain) structure having an LDD region between the channel forming region and the drain region (or the source region) may also be used. This structure is one in which a region having a low concentration of an added impurity element is formed between the channel forming region and the source region or the drain region formed by adding a high concentration impurity element, and this region is referred to as an LDD region. In addition, a GOLD (gate drain overlapped LDD) structure in which the LDD region overlaps with the gate electrode through the gate insulating film may also be used.

Further, although an n-channel TFT is used for the explanation here, it is of course also possible to form a p-channel TFT by using an impurity element that imparts p-type conductivity to a semiconductor as a substitute for the impurity element that imparts n-type conductivity to a semiconductor.

An example of a top gate TFT is explained here, but it is possible to apply the present invention regardless of the TFT structure. For example, it is possible to apply the present invention to a bottom gate TFT (reverse stagger type) and to a forward stagger TFT.

Embodiment Mode 2

Gettering sites may also be formed by adding a noble (rare) gas element to only the upper layer of the second semiconductor film, without forming the third semiconductor film, shown in Embodiment mode 1. An example of this is explained here using FIGS. 2A to 2G.

Manufacturing up through the formation of a barrier layer 205 is similar to that of Embodiment mode 1. A base insulating film 201 is formed on a substrate 200, and the barrier layer 205 is formed after forming a semiconductor film 204 having a crystalline structure, all in accordance with Embodiment mode 1. Crystallization is also performed here using nickel, as in Embodiment mode 1. Note that FIG. 2A corresponds to FIG. 1A, and that FIG. 2B corresponds to FIG. 1B.

A second semiconductor film 206 is formed next on the barrier layer 205. (See FIG. 2C.) The second semiconductor film 206 contains an inert gas element. The semiconductor film 206 having an amorphous structure may be formed, and the semiconductor film 206 having a crystalline structure may also be formed. It is preferable to include oxygen in the second semiconductor film 206 (at a concentration measured by SIMS analysis equal to or greater than $5 \times 10^{18}/cm^3$, preferably equal to or greater than $1 \times 10^{19}/cm^3$) to increase gettering efficiency.

Figure 2D:
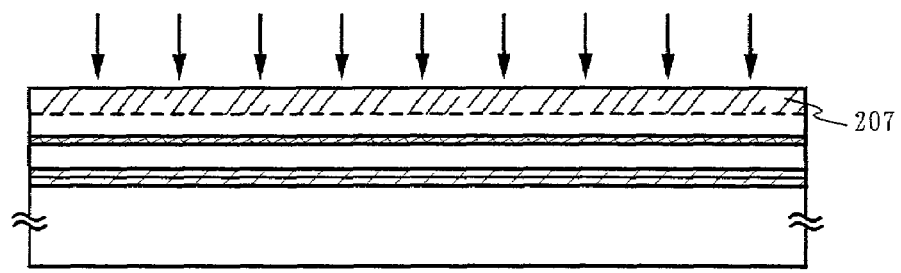
Figure 2E:
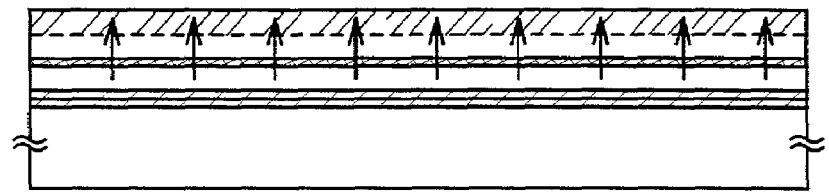
Figure 2F:
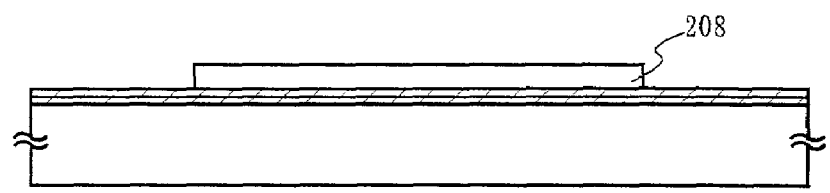
Figure 2G:
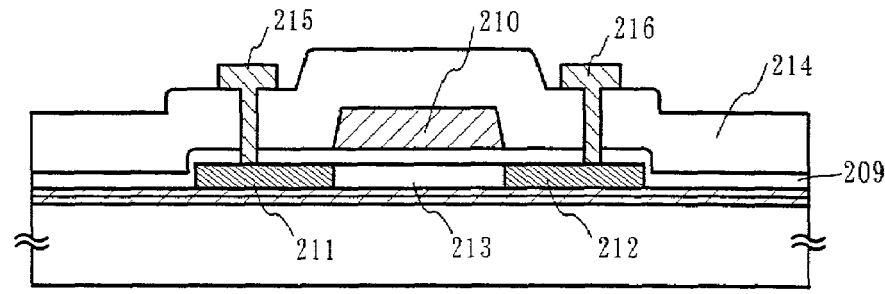

A noble (rare) gas element is then added to an upper layer of the second semiconductor film 206. A region to which the noble (rare) gas element is added is denoted by reference numeral 207, as shown in FIG. 2D. The region 207 contains gettering sites.

Gettering is performed next. A heat treatment process is performed within a nitrogen atmosphere at 450 to 800° C. for 1 to 24 hours as a process for performing gettering, for example at 550° C. for 14 hours. Strong light may also be irradiated as a substitute to the heat treatment process. Strong light may also be irradiated in addition to the heat treatment process. Nickel moves in the direction of an arrow in FIG. 2E due to the gettering, and the metallic element contained in the semiconductor film 204 covered with the barrier layer 205 is removed, or reduced in concentration. Sufficient gettering is performed here so that nickel is not segregated in the first semiconductor film 204, but moves to the upper layer 207 of the second semiconductor film, and almost no nickel exists in the first semiconductor film 204.

Next, only the semiconductor films denoted by reference numerals 206 and 207 are selectively removed, with the barrier layer 205 acting as an etching stopper, and a semiconductor layer 208 is formed having a desired shape by using a known patterning technique on the semiconductor film 204.

Subsequent process steps are in accordance with Embodiment mode 1, and a gate insulating film 209 and a gate electrode 210 are formed. After forming a source region 211 and a drain region 212 by performing addition of an impurity element that imparts n-type conductivity to a semiconductor, an interlayer insulating film 214 is formed. Hydrogenation is then performed, and contact holes for reaching the source region and the drain region are formed. A TFT is completed after forming a source electrode 215 and a drain electrode 216.

The TFT thus obtained also has, at least, nickel elements removed from a channel forming region 213, and also does not contain inert gas elements in the channel forming region 213.

An additionally detailed explanation of the present invention having the above structures is made using embodiments shown below.

EMBODIMENTS

Embodiment 1

Here, a method of manufacturing a pixel portion and driver circuit TFTs (an n-channel TFT and a p-channel TFT) formed in the periphery of the pixel portion at the same time and on the same substrate is explained using FIGS. 3A to 5.

First, a substrate 300 made from a glass such as barium borosilicate glass or aluminum borosilicate glass, typically Coming Corp. #7059 glass or #1737 glass, is used in Embodiment 1. Note that, provided that the substrate has transparency to light, a quartz substrate may also be used as the substrate 300. Further, a plastic substrate having resistance to heat that is able to withstand the processing temperatures of Embodiment 1 may also be used.

Next, a base film 301 made from an insulating film such as a silicon oxide film, a silicon nitride film, or a silicon oxynitride film is formed on the substrate 300. A two layer structure is used as the base film 301 in Embodiment 1, but a single layer insulating film or one having a lamination structure with more than two such layers may also be used. A silicon oxynitride film 301a deposited using plasma CVD and with $SiH_4$, $NH_3$, and $N_2O$ as reaction gasses is formed having a film thickness of 10 to 200 nm (preferably between 50 and 100 nm) as a first layer of the base film 301. A silicon oxynitride film having a film thickness of 50 nm (composition ratio: Si=32%, O=27%, N=24%, and H=17%) is formed as the first layer 301a in Embodiment 1. Next, a silicon oxynitride film 301b deposited using plasma CVD and with $SiH_4$ and $N_2O$ as reaction gasses is formed having a film thickness of 50 to 200 nm (preferably between 100 and 150 nm) as a second layer of the base film 301. A silicon oxynitride film having a film thickness of 100 nm (composition ratio: Si=32%, O=59%, N=7%, and H=2%) is formed as the second layer 301b in Embodiment 1.

Semiconductor layers 302 to 306 are formed next on the base film. After forming a semiconductor film having an amorphous structure by a known means (such as sputtering, LPCVD, or plasma CVD), a known crystallization process (such as laser crystallization, thermal crystallization, or thermal crystallization using a catalyst such as nickel) is performed. The crystalline semiconductor film obtained is then patterned into a desired shape to thereby obtain each of the semiconductor layers 302 to 306. The semiconductor layers 302 to 306 are formed having a thickness of 25 to 80 nm (preferably from 30 to 60 nm). There are no limitations placed on the crystalline semiconductor film material, but it is preferable to use silicon or a silicon germanium alloy ($Si_xGe_{1-x}$, where x=0.0001 to 0.02). For example, a silicon germanium film is formed containing from 0.02 to 2 molecular % of germanium with respect to silicon.

After forming an amorphous silicon film having a thickness of 55 nm using plasma CVD, a solution containing nickel is maintained on the amorphous semiconductor film in Embodiment 1. Thermal crystallization (at 550° C. for 4 hours) is performed after performing dehydrogenation (at 500° C. for 1 hour) of the amorphous silicon film. Laser annealing is then performed in order to further improve crystallization, and a crystalline silicon film is formed. Then, in accordance with Embodiment mode 1, an extremely thin oxide film is formed on the surface by using a solution containing ozone. A second semiconductor film containing oxygen (at a concentration measured by SIMS analysis equal to or greater than $5\times10^{18}/cm^3$, preferably equal to or greater than $1\times10^{19}/cm3$), and a third semiconductor film containing a noble (rare) gas element are formed on a surface of the oxide film. Gettering in then performed in accordance with Embodiment mode 1 by performing a heat treatment process, after which the second semiconductor film and the third semiconductor film, using the oxide film as etching stoppers, are removed. The crystalline silicon film is patterned, and the oxide film is removed. The semiconductor layers 302 to 306 made from the crystalline silicon film, in which the nickel concentration is equal to or less than $1\times10^{18}/cm^3$, preferably equal to or less than $1\times10^{17}/cm^3$, are thus formed. A state after patterning of the semiconductor layers 302 to 306 is completed corresponds to FIG. 1F in Embodiment mode 1. Note that doping (also referred to as channel doping) of a very small amount of an impurity element (boron or phosphorous) in order to control the TFT threshold value may also be performed appropriately.

Cleaning of the surface of the semiconductor layers 302 to 306 is then performed using a hydrofluoric acid etchant such as buffered hydrofluoric acid. An insulating film 307 having silicon as its main constituent is formed next by plasma CVD or sputtering to a thickness of 40 to 150 nm. A 115 nm thick silicon oxynitride film (composition ratio: Si=32%, O=59%, N=7%, and H=2%) is formed by plasma CVD in Embodiment 1. The insulating film, which becomes a gate insulating film, is of course not limited to a silicon oxynitride film. Other insulating films containing silicon may also be used, as single layers or as lamination layer structures.

Next, as shown in FIG. 3A, a first conductive film 308 having a film thickness of 20 to 100 nm, and a second conductive film 309 having a film thickness of 100 to 400 nm are formed as laminated on the gate insulating film 307. The first conductive film 308 is formed from a TaN film having a film thickness of 30 nm, and the second conductive film 309 is formed to be laminated from a W film having a film thickness of 370 nm in Embodiment 1. The TaN film is formed by sputtering. A ta target is used, and sputtering is performed in an atmosphere containing nitrogen. Furthermore, the W film is formed by sputtering using a W target. In addition, the W film can also be formed by thermal CVD using tungsten hexafluoride ($WF_6$).

Note that although the first conductive film 308 is TaN, and the second conductive film 309 is W in Embodiment 1, there are no particular limitations placed on these films. Both films may be formed having a single layer or lamination layer, and from an element selected from the group consisting of Ta, W, Ti, Mo, Al, Cu, Cr, and Nd, or from an alloy material or chemical compound having one of the aforementioned elements as its main constituent. Further, a semiconductor film, typically a polycrystalline silicon film in which an impurity element such as phosphorous is doped, may also be used. An AgPdCu alloy may also be used. In addition, the following may also be used: forming the first conductive film by a tantalum (Ta) film and combining it with the second conductive film formed from a W film; forming the first conductive film by a titanium nitride (TiN) film and combining it with the second conductive film formed from a W film; forming the first conductive film by a tantalum nitride (TaN) film and combining it with the second conductive film formed from an Al film; and forming the first conductive film from a tantalum nitride (TaN) film and combining it with the second conductive film formed by a Cu film.

Masks 310 to 315 are formed next from resist using a photolithography method, and a first etching process is performed in order to form electrodes and wirings. The first etching process is performed under first and second etching conditions. An ICP (inductively coupled plasma) etching method is used in Embodiment 1 for the first etching condition. A gas mixture of $CF_4$, $Cl_2$, and $O_2$ is used as an etching gas, the gas flow rates are set to 25/25/10 sccm, respectively, a plasma is generated by applying a 500 W RF electric power (13.56 MHz) to a coil shape electrode at a pressure of 1 Pa, and etching is performed. Note that a chlorine gas, typically a gas such as $Cl_2$, $BCl_3$, $SiCl_4$ and $CCl_4$, a hydrofluoride gas, typically a gas such as $CF_4$, $SF_6$ $NF_3$, and $O_2$ can also be used as the etching gas appropriately. A Matsushita Electric Inc. Dry etching apparatus (model E645-ICP) using an ICP is employed. A 150 W RF electric power (13.56 MHz) is also applied to the substrate side (test piece stage), thereby effectively applying a negative self-bias. The W film is etched under the first etching conditions, and the edge portion of the first conductive layer is made into a tapered shape. The etching speed of W is 200.39 nm/min under the first etching conditions, and the etching speed of TaN is 80.32 nm/min, resulting in a selection ratio of W with respect to TaN of approximately 2.5. Further, the taper angle of W becomes approximately 26° under the first etching conditions.

Thereafter, the etching conditions are changed to second etching conditions without removing the resist masks 310 to 315. A gas mixture of $CF_4$ and $Cl_2$ is used as an etching gas, the gas flow rates are set to 30/30 sccm, respectively, a plasma is generated by applying a 500 W RF electric power (13.56 MHz) to a coil shape electrode at a pressure of 1 Pa, and etching is performed for approximately 30 seconds. A 20 W RF electric power (13.56 MHz) is also applied to the substrate side (test piece stage), thereby effectively applying a negative self-bias. The W film and the TaN film are both etched at a rate on the same order by the second etching conditions using the $CF_4$ and $Cl_2$ gas mixture. The etching speed is 58.97 nm/min with respect to W, and the etching speed is 66.43 nm/min with respect to TaN under the second etching conditions. Note that in order for etching to be performed such that no residue remains on the gate insulating film, the etching time may be increased on the order of 10 to 20%.

Edge portions of the first conductive layer and the second conductive layer are made into a tapered shape due to the effect of a bias voltage applied to the substrate side under the above first etching conditions by using a suitable resist mask shape. The angle of the tapered portions is from 15 to 45°.

First shape conductive layers 316 to 321 (first conductive layers 316a to 321a, and second conductive layers 316b to 321b) are thus formed from the first conductive layers and the second conductive layers by the first etching process. Although not shown in the figures, a region of the insulating film 307, that becomes a gate insulating film, which is not covered with the first shape conductive layers 316 to 321 is etched by on the order of 10 to 20 nm, forming a thinner region.

Following the first etching process, a second etching process is performed next in Embodiment 1 without removing the resist masks. A mixture of $SF_6$, $Cl_2$, and $O_2$ is used as the etching gas, the gas flow rates are set to 24/12/24 sccm, respectively, a plasma is generated by applying a 700 W RF electric power (13.56 MHz) to a coil shape electrode at a pressure of 1.3 Pa, and etching is performed for approximately 25 seconds. A 10 W RF electric power (13.56 MHz) is also applied to the substrate side (test piece stage), thereby effectively applying a negative self-bias. The etching speed of W is 227.3 nm/min, and the etching speed of TaN is 32.1 nm/min under the second etching conditions, resulting in a selection ratio of W with respect to TaN of 7.1. The etching speed with respect to SiON, the insulating film 307, is 33.7 nm/min, giving a selection ratio of W with respect to SiON of 6.83. Film reduction of the insulating film 307 can be suppressed when using $SF_6$ as an etching gas because the selection ratio of TaN with respect to the insulating film 307 is high. Further, reliability increases the larger the width of the tapered portion in the channel length direction becomes in the driver circuit TFTs, and therefore it is effective to perform dry etching using an etching gas containing $SF_6$.

The taper angle of W becomes 70° due to the second etching process. Second conductive layers 322b to 327b are formed by the second etching process. The first conductive layer is almost not etched, however, and first conductive layers 322a to 327a are formed. It is also possible to use $CF_4$, $Cl_2$, and $O_2$ as etching gasses in the second etching process.

The resist masks are removed next, a first doping process is performed, and the state of FIG. 3C is obtained. The first conductive layers 322a to 327a are used as masks with respect to an impurity element, and doping is performed so that the impurity element is not added to the semiconductor layer under the tapered portion of the first conductive layers. Phosphorous (P) is used as the impurity element in Embodiment 1, and plasma doping is performed using 5% phosphine ($PH_3$) diluted by hydrogen gas at a gas flow rate of 30 sccm. A low concentration impurity region (n−−region) 328 is thus formed overlapping with the first conductive layer. The concentration of phosphorous (P) added to the low concentration impurity region 328 is from $1\times10^{17}$ to $1\times10^{19}/cm^3$.

The first doping process may also be performed such that the impurity element is also added to the semiconductor layer beneath the tapered portion of the first conductive layer. A concentration gradient develops in this case in accordance with the film thickness of the tapered portion of the first conductive layer.

A second doping process is performed next after forming masks 329 and 330 from resist, and an impurity element that imparts n-type conductivity to the semiconductor layers is added. (See FIG. 4A.) Note that the semiconductor layer which later becomes an active layer of the p-channel TFT is covered with the masks 329 and 330. The doping process may be performed by ion doping or ion injection. Phosphorous is used here as the impurity element that imparts n-type conductivity, and is added using ion doping with 5% phosphine ($PH_3$) diluted by hydrogen gas.

The conductive layer 323 becomes a mask with respect to phosphorous in the semiconductor layer 303 that later becomes an n-channel TFT of a logic circuit portion, and high concentration impurity regions (n+ regions) 343 and 344 are formed in a self-aligning manner. Further, the impurity element is also added below the tapered portion during the second doping, forming low concentration impurity regions (n− regions) 333 and 334. The later formed n-channel TFT of a logic circuit portion is only provided with regions that overlap with a gate electrode (GOLD regions). Note that the impurity concentration (P concentration) gradually becomes lower from an edge portion toward the inside of the tapered portion of the first conductive layer in the semiconductor layer overlapping with the tapered portion of the first conductive layer in the low concentration impurity element regions (n− regions) 333 and 334.

High concentration impurity regions 345 and 346 are formed by the second doping process in the semiconductor layer 305 that later becomes an n-channel TFT of a sampling circuit portion. Low concentration impurity regions (n− regions) 335 and 336 are formed in regions that are covered with the mask 331. Consequently the n-channel TFT of the sampling circuit portion is only provided with a low concentration impurity region (LDD region) that does not overlap with a gate electrode.

High concentration impurity regions 347 to 350 are formed by the second doping process in regions not covered with the mask 332 in the semiconductor layer 306 that later becomes an n-channel TFT of a pixel portion. Low concentration impurity regions (n− regions) 337 to 340 are formed in regions covered with the mask 332. Therefore the n-channel TFT of the pixel portion is only provided with low concentration impurity regions that do not overlap with a gate electrode (LDD regions). Furthermore, a high concentration impurity region 350 is formed in a self-aligning manner in a region that later becomes a capacitor portion of the pixel portion, and a low concentration impurity regions (n− regions) 341 and 342 are formed under the tapered portion.

The impurity element which imparts n-type conductivity is added to the high concentration impurity regions 343 to 350 at a concentration rage from $3\times10^{19}$ to $1\times10^{21}/cm^3$ by the second doping process.

A noble (rare) gas element may also be added before or after the second doping process, and additional gettering can be performed later by a heat treatment process in this case. Also, in this case, it is preferable to use a mask formed so that the noble (rare) gas element is added to the edge portions of all of the semiconductor layers.

The masks 329 to 332 are removed next, after which the semiconductor layers that later become the active layers of the n-channel TFT are covered with masks 351 to 353. A third doping process is then performed. (See FIG. 4B.) A p-type impurity element is added through the tapered portions, and regions are formed containing the p-type impurity element at a low concentration (regions overlapping with the gate electrodes (GOLD regions) 354b to 357b). Regions 354a to 357a containing the n-type impurity element at a low concentration and containing the p-type impurity element at a high concentration are formed by the third doping process. Although a low concentration of phosphorous is contained in the regions 354a to 357a, the third doping process is performed such that the concentration of boron becomes $6 \times 10^{19}$ to $6 \times 10^{20}/cm^3$. No problems will develop because these regions are used as source regions or drain regions of p-channel TFTs.

Although the first doping process, the second doping process, and the third doping process are performed in order in Embodiment 1, there are no particular limitations placed on the order. The order of process steps may be freely changed.

The resist masks 351 to 353 are removed next, and a first interlayer insulating film 358 is formed. An insulating film containing silicon is formed as the first interlayer insulating film 358 by performing plasma CVD or sputtering to a thickness of 10 to 200 nm.

Figures 4A, 4B, 4C:
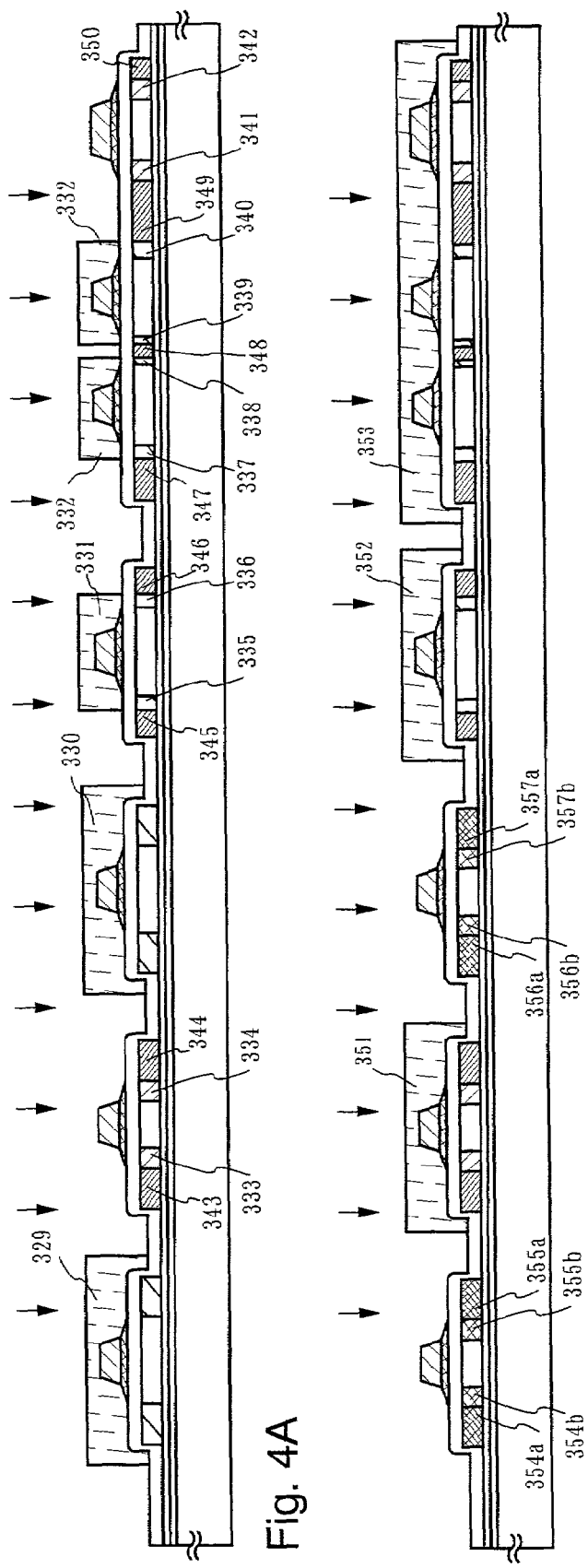
FIGS. 4A to 4C are diagrams showing the process of manufacturing an active matrix substrate.

Next, a process of activating the impurity elements added to each of the semiconductor layers is performed, as shown in FIG. 4C. The activation process is performed by irradiating a YAG laser or an excimer laser from the reverse side of the substrate. Activation of the impurity regions overlapping with the gate electrode through the insulating film can be performed by irradiating from the reverse side.

Although an example of forming the first interlayer insulating film before performing the above activation is shown in Embodiment 1, the first interlayer insulating film formation step may also be performed after performing the above activation.

A second interlayer insulating film 359 is formed next from a silicon nitride film, and a heat treatment process is performed (heat treatment for 1 to 12 hours at 300 to 550° C.), thereby performing hydrogenation of the semiconductor layers. A heat treatment process is performed for 1 hour at 410° C. within a nitrogen atmosphere in Embodiment 1. This process is one of terminating dangling bonds in the semiconductor layers by hydrogen contained in the second interlayer insulating film 359. The semiconductor layers can be hydrogenated whether or not the first interlayer insulating film exists. Plasma hydrogenation (in which hydrogen excited by a plasma is used) may also be performed as another means for the a hydrogenation.

A third interlayer insulating film 360 is formed next from an organic insulating material on the second interlayer insulating film 359. An acrylic resin film is formed having a film thickness of 1.6 μm in Embodiment 1. Patterning is then performed in order to form contact holes for reaching each high concentration impurity region. A plurality of etching processes is performed in Embodiment 1. After etching the third interlayer insulating film with the second interlayer insulating film used as an etching stopper, the second interlayer insulating film is etched with the first interlayer insulating film used as an etching stopper. The first interlayer insulating film is then etched.

Electrodes 361 to 369 that are electrically connected to the respective high concentration impurity regions, and a pixel electrode 370 that is electrically connected to the high concentration impurity region 349 are formed. A material having superior reflectivity, such as a film containing Al or Ag as its main constituent, or a lamination film of such films, is used as the electrode and pixel electrode material here.

A driver circuit 401 having: a logic circuit portion 403 composed of an n-channel TFT 406 and a p-channel TFT 405, and a sampling circuit portion 404 composed of an n-channel TFT 408 and a p-channel TFT 407; and a pixel portion 402 having a pixel TFT composed of an n-channel TFT 409 and a storage capacitor 410 can thus be formed on the same substrate. (See FIG. 5.)

Note that the n-channel TFT 409 uses a structure having two channel forming regions between a source region and a drain region in Embodiment 1 (double gate structure). Embodiment 1 is not limited to the double gate structure, however. A single gate structure in which one channel forming region is formed, and a triple gate structure in which three channel forming regions are formed may also be used.

High concentration impurity regions suited to each circuit are made separately in a self-aligning manner or by using a mask in accordance with the second doping process in Embodiment 1. The TFT structures of the n-channel TFTs 406, 408, and 409 are all low concentration drain (LDD: lightly doped drain) structures. In addition, the n-channel TFT 406 has a GOLD structure in which the LDD region is disposed overlapping with the gate electrode through the gate insulating film. The n-channel TFTs 408 and 409 have structures which only include regions that do not overlap with the gate electrodes (LDD regions). Note that low concentration impurity regions (n– regions) which overlap with a gate electrode through an insulating film are referred to as GOLD regions in this specification, and that low concentration impurity regions (n– regions) that do not overlap with a gate electrode are referred to as LDD regions. The width in the channel direction of the regions that do not overlap with a gate electrode (LDD regions) can be freely set by suitably changing the mask used during the second doping process. Furthermore, if the first doping process conditions are changed so that the impurity element is also added below the tapered portions, then it is possible to make the n-channel TFTs 408 and 409 have structures provided with both regions that overlap with the gate electrodes (GOLD regions) and regions that do not overlap with the gate electrodes (LDD regions).

Note that it is possible to apply the method of forming a semiconductor layer from Embodiment mode 2 as a substitute for the method of forming a semiconductor layer from Embodiment mode 1 when forming the semiconductor layers 302 to 306 in Embodiment 1.

Embodiment 2

An example of performing crystallization by a method which differs from that of Embodiment mode 1 is shown in FIGS. 6A to 6D in Embodiment 2.

First, a base insulating film 701 and an amorphous semiconductor film 702 are formed on a substrate 700, as in Embodiment mode 1. An insulating film having silicon as its main constituent is formed next, and a mask 703 made from resist is formed. The insulating film is then selectively removed using the mask 703, forming a mask 704. (See FIG. 6A.)

A metallic element containing layer 705 is then formed after removing the mask 703. The metallic element is selectively added to the amorphous semiconductor film positioned in regions not covered with the mask 704 here. (See FIG. 6B.)

A heat treatment process is performed next, causing crystallization, and a semiconductor film 706 having a crystalline structure is formed. The heat treatment process using an electric furnace or the irradiation of strong light may be used for the heat treatment process. Heat treatment may be performed at 500 to 650° C. for between 4 and 24 hours, for example at 550° C. for 4 hours, if heat treatment using an electric furnace is used. Crystallization proceeds along with the diffusion of nickel in directions shown by arrows in FIG. 6C. The amorphous semiconductor film contacting the mask 704 made from the insulating film is crystallized due to the action of nickel by the heat treatment process.

The mask 704 is removed next, and the semiconductor film 706 having a crystalline structure is obtained. (See FIG. 6D.)

Subsequent process steps may be performed in accordance with Embodiment mode 1 or Embodiment 1. Note that FIG. 6D corresponds with FIG. 1B.

Further, it is possible to combine Embodiment 2 with Embodiment mode 2.

Embodiment 3

In this embodiment, a process for manufacturing an active matrix liquid crystal display device using the active matrix substrate manufactured in Embodiment 1 will be described. The description is made with reference to FIG. 7.

Figure 5:
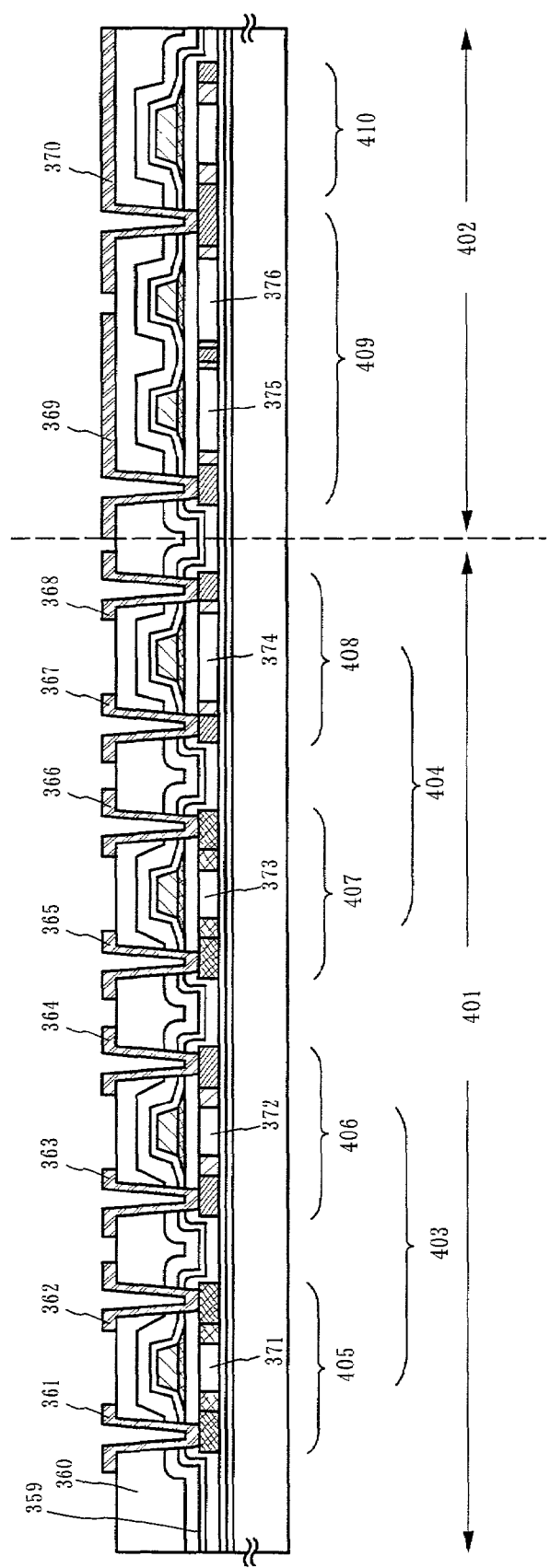
FIG. 5 is a diagram showing the process of manufacturing an active matrix substrate.
Figure 6A:
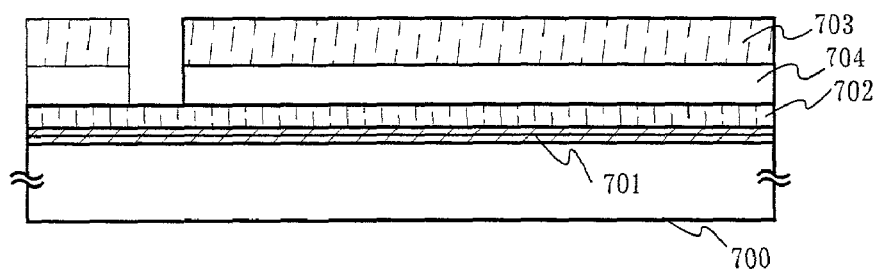
FIGS. 6A to 6D are diagrams showing crystallization of a semiconductor film.
Figure 6B:
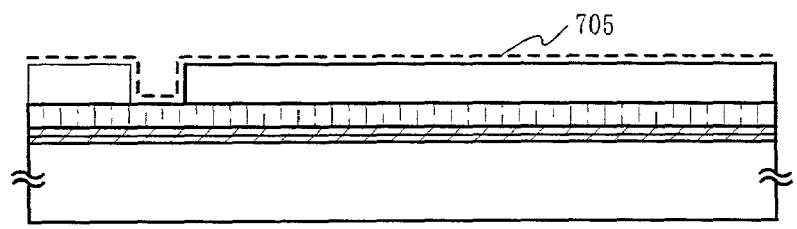
Figure 6C:
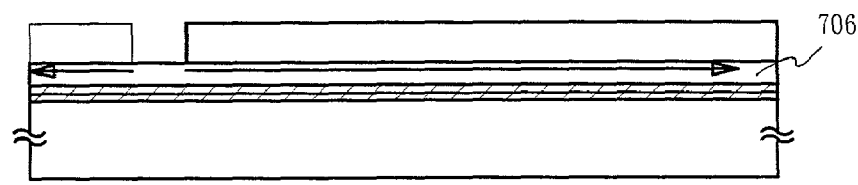
Figure 6D:
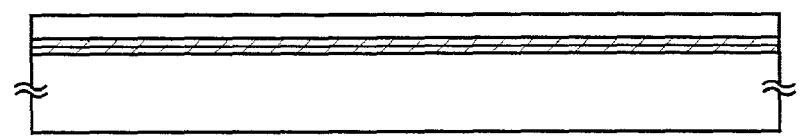

First, after the active matrix substrate with the state of FIG. 5 is obtained according to Embodiment 1, an orientation film is formed on the active matrix substrate of FIG. 5 to perform a rubbing process. Note that, in this embodiment, before the formation of the orientation film, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate is prepared. A color filter in which a colored layer and a light shielding layer are arranged corresponding to each pixel is provided in this opposing substrate. Also, a light shielding layer is provided in a portion of a driver circuit. A leveling film for covering this color filter and the light shielding layer is provided. Next, a counter electrode made of a transparent conductive film is formed in a pixel portion on the leveling film, and then an orientation film is formed on the entire surface of the opposing substrate to perform a rubbing process.

Then, the active matrix substrate in which the pixel portion and the driver circuit are formed and the opposing substrates are adhering to each other by using a sealing member. The filler is mixed with the sealing member, and two substrates are adhering to each other with a uniform interval by this filler and the columnar spacer After that, a liquid crystal material is injected into a space between both substrates and then completely encapsulated by a sealing member (not shown). A known liquid crystal material may be used as the liquid crystal material. Thus, the active matrix liquid crystal display device is completed. If necessary, the active matrix substrate or the opposing substrate is cut with a predetermined shape. Also, a polarization plate and the like are suitably provided using a known technique. And, an FPC is adhering to the active matrix liquid crystal display device using a known technique.

A structure of a liquid crystal module thus obtained will be described using a top view of FIG. 7. Note that the same reference symbols are used for portions corresponding to those of FIG. 5.

Figure 7:
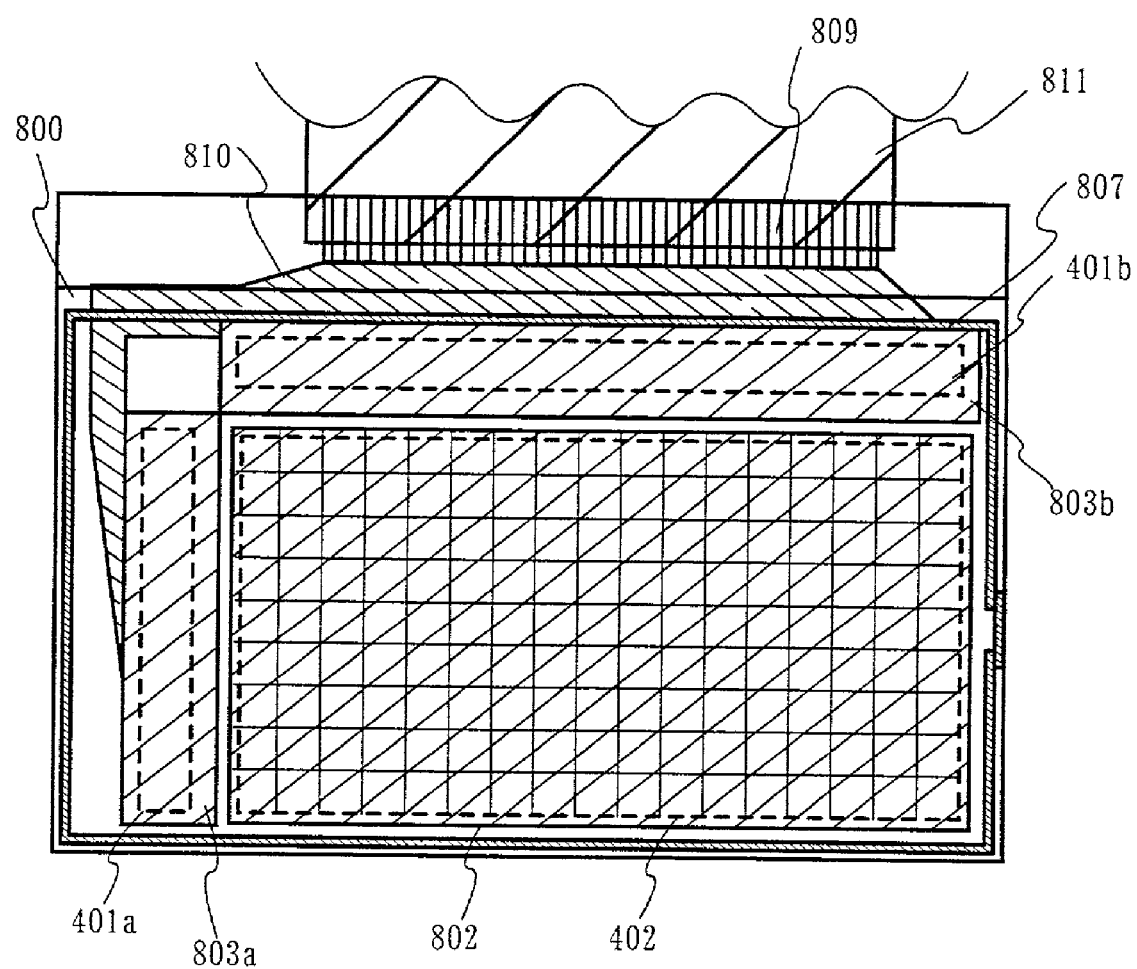
FIG. 7 is an upper surface diagram of an active matrix liquid crystal display device.

The top view of FIG. 7 shows the state that the active matrix substrate and the opposing substrate 800 are adhering to each other through the sealing member 807. Over the active matrix substrate, an external input terminal 809 to which the pixel portion, the driver circuit, and the FPC (flexible printed circuit) 811 are adhering, a wiring 810 for connecting the external input terminal 809 with an input portion of the respective circuits, and the like are formed. Also, the color filter and the like are formed in the opposing substrate 800.

A light shielding layer 803a is provided in the opposing substrate side so as to overlap with a gate wiring side driver circuit 401a. Also, a light shielding layer 803b is provided in the opposing substrate side so as to overlap with a source wiring side driver circuit 401b. In a color filter 802 which is provided over the opposing substrate side on a pixel portion 402, a light shielding layer and colored layers for respective colors red color (R), green color (G), and blue color (B) are provided corresponding to each pixel. Actually, a color display is formed using three colors, that is, the colored layer for the red color (R), the colored layer for the green color (G), and the colored layer for the blue color (B). Note that the colored layers for respective colors are arbitrarily arranged.

Here, for a color display, the color filter 802 is provided over the opposing substrate. However, the present invention is not particularly limited to this case, and in manufacturing the active matrix substrate, the color filter may be formed over the active matrix substrate.

Also, in the color filter, the light shielding layer is provided between adjacent pixels such that a portion except for a display region is shielded. The light shielding layers 803a and 803b are provided in a region covering the driver circuit. However, when the liquid crystal display device is incorporated into an electronic device as a display portion thereof, the region covering the driver circuit is covered with a cover. Thus, the color filter may be constructed without the light shielding layer. In manufacturing the active matrix substrate, It the light shielding layer may be formed over the active matrix substrate.

Also, without providing the light shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light shielded.

Also, the FPC 811 which is composed of the base film and the wiring is adhering to the external input terminal by using an anisotropic conductive resin. Further, a reinforced plate is provided to increase a mechanical strength.

The liquid crystal module manufactured above can be used as the display portion of various electronic equipment.

The above-mentioned liquid crystal module can be either one of AC driving and DC driving.

This embodiment can be freely combined with either one of Embodiment mode 1, 2, Embodiment 1 and 2.

Embodiment 4

Embodiments 1 or 3 show an exemplary reflection type display device in which a pixel electrode is made of a metal material with reflectivity. In this embodiment, an exemplary transmission type display device is shown, in which a pixel electrode is made of a conductive film with light transparency.

The processes up to the process of forming an interlayer insulating film 1100 are the same as those in Embodiment 1. Therefore, these processes will be omitted here. After the interlayer insulating film 1100 is formed in accordance with Embodiment 1, a pixel electrode 1101 made of a conductive film with light transparency is formed. As the conductive film having light transparency, ITO (indium tin oxide alloy), $In_2O_3(ZnO)$, zinc oxide (ZnO), or the like may be used.

Thereafter, contact holes are formed in the interlayer insulating film 1100. Then, connection electrodes 1102 overlapping the pixel electrodes 1101 are formed. The connection electrode 1102 is connected to drain regions through contact holes. Furthermore, a source electrode or a drain electrode of another TFT is also formed simultaneously with the connection electrodes 802.

Herein, an example in which all the driver circuits are formed on a substrate is shown. However, several ICs may be used in a part of a driver circuit.

Figure 8:
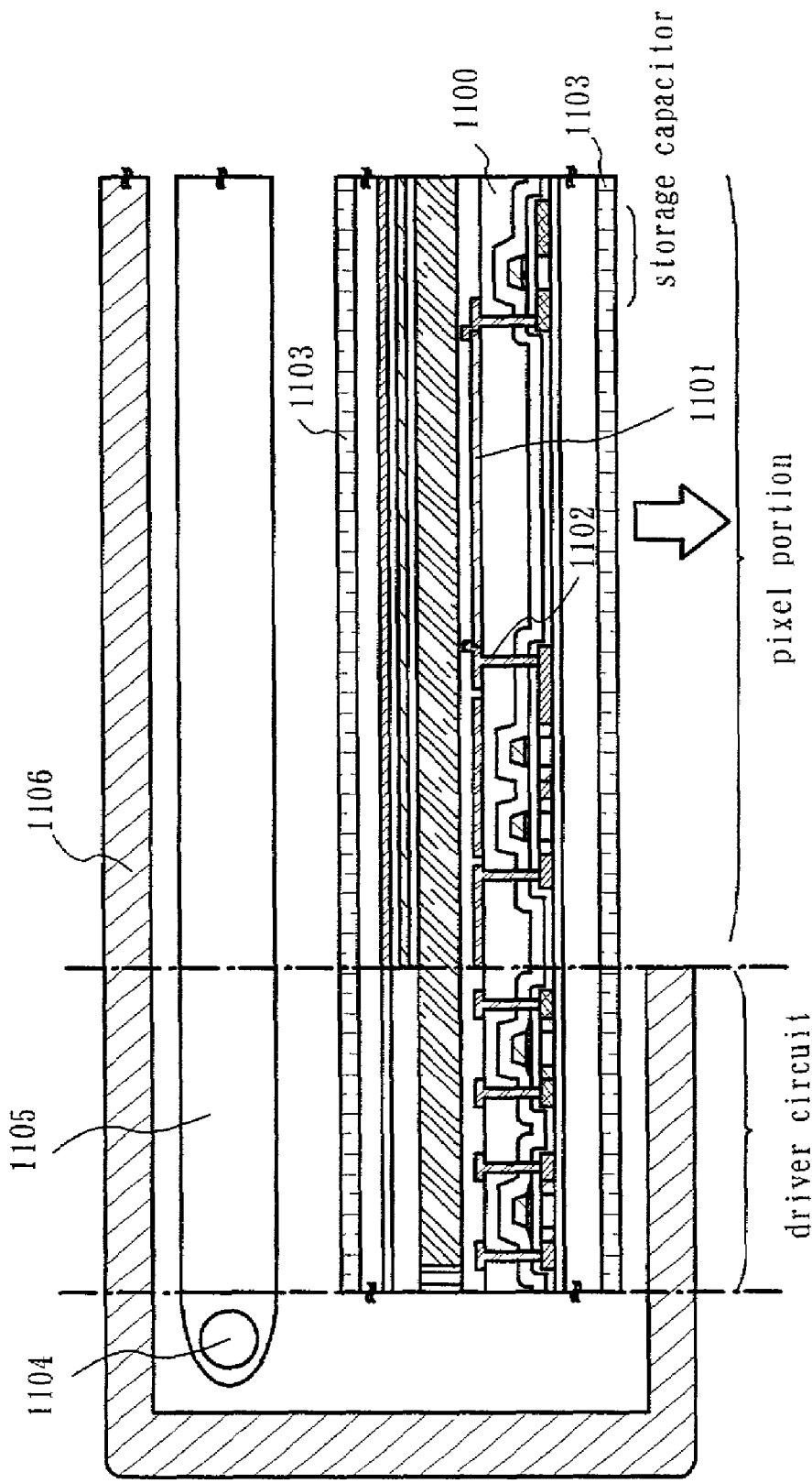
FIG. 8 is a diagram showing a transmission type example.

An active matrix substrate is formed as described above. A liquid crystal module is manufactured in accordance with Embodiment 3, using the active matrix substrate, and a backlight 1104 and a light guiding plate 1105 are provided, followed by disposing a cover 1106, whereby an active matrix type liquid crystal display apparatus as shown in FIG. 8 is completed. The cover 1106 and the liquid crystal module are attached to each other with an adhesive or an organic resin. Furthermore, a substrate may be attached to a counter substrate by filling an organic resin between a frame and a substrate so as to surround the frame. Since the apparatus is of a transmission type, polarizing plates 1103 are attached to both the active matrix substrate and the counter substrate.

This embodiment can be combined with either one of Embodiments 1 to 3.

Embodiment 5

Figure 9A:
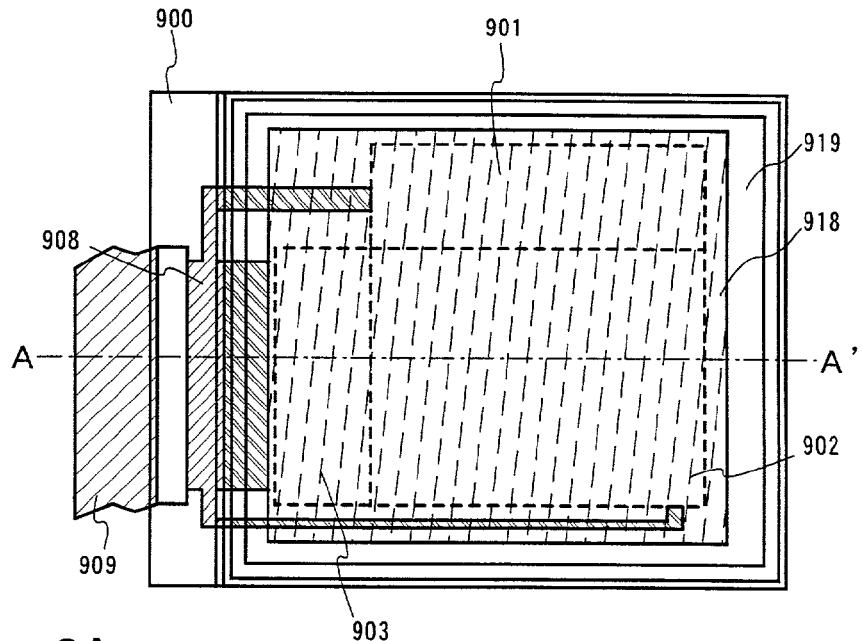
FIGS. 9A and 9B are an upper surface diagram and a cross sectional diagram, respectively, showing an EL module.
Figure 9B:
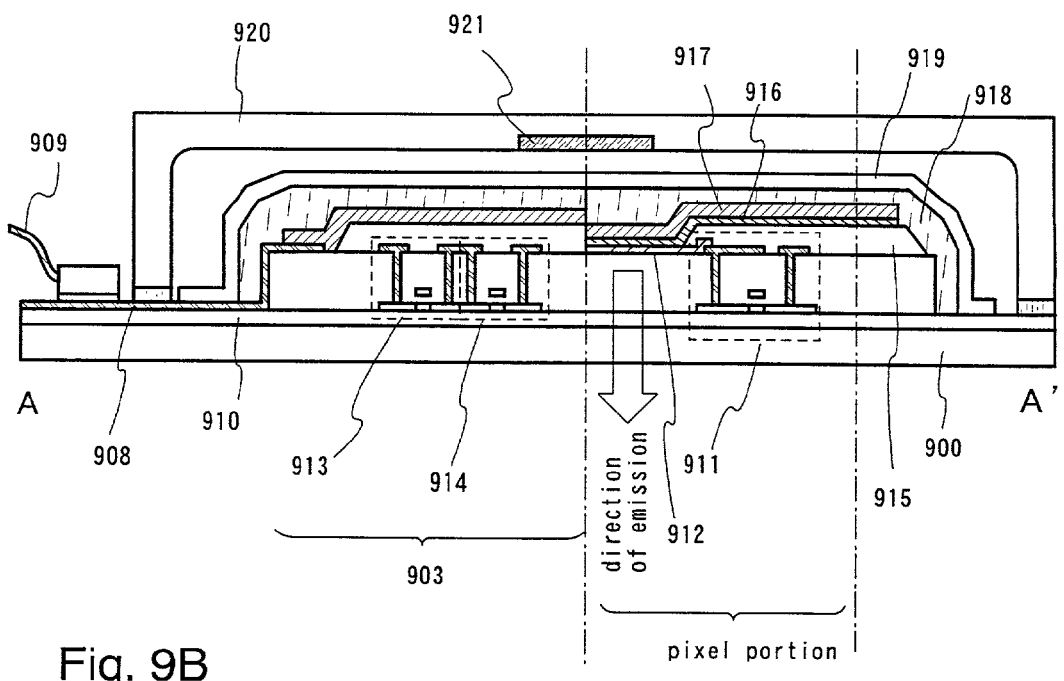

An example of manufacturing a light emitting display device provided with EL (electroluminescence) elements is shown in FIGS. 9A and 9B in Embodiment 5.

FIG. 9A is an upper surface diagram showing an EL module, and FIG. 9B is a cross sectional diagram of FIG. 9A cut along a line A-A'. A pixel portion 902, a source side driver circuit 901, and a gate side driver circuit 903 are formed on a substrate 900 having an insulating surface (for example, a substrate such as a glass substrate, a crystallized glass substrate, or a plastic substrate). The pixel portion and the driver circuits can be obtained in accordance with the above-mentioned embodiments. Further, reference numeral 918 denotes a sealing material, and reference numeral 919 denotes a protective film. The pixel portion and the driver circuit portion are covered with the sealing material 918, and the sealing material is covered with a protective film 919. In addition, sealing is performed by a cover material 920 using an adhesive. It is preferable that the cover material 920 be the same substance as the substrate 900 in order to be able to withstand changes in shape due to heat and external forces, for example a glass substrate, and a concave shape (depth 3 to 10 μm) is produced as shown in FIGS. 9A and 9B by a method such as sand blasting. In addition, it is preferable to form a concave portion (depth 50 to 200 μm) in which it is possible to place a drying agent 921. Furthermore, if a multi-faced EL module is manufactured, then sectioning may be performed, using means such as a $CO_2$ laser, after joining the substrate and the cover material so that side faces become uniform.

Note that reference numeral 908 denotes a wiring for transmitting input signals to the source side driver circuit 901 and to the gate side driver circuit 903. Video signals and clock signals are received form an FPC (flexible printed circuit) 909 as an external input terminal. Note that although only the FPC is shown in the figures here, a printed wiring board (PWB) may also be attached to the FPC. The term light emitting device in this specification includes not only the light emitting device itself, but also a state in which an FPC or a PWB are attached thereto.

The cross sectional structure is explained next using FIG. 9B. An insulating film 910 is formed on the substrate 900, and the pixel portion 902 and the gate side driver circuit 903 are formed on the insulating film 910. The pixel portion 902 is formed by a plurality of pixels containing an electric current control TFT 711 and a pixel electrode 912 that is electrically connected to the drain of the electric current control TFT 711. Further, the gate side driver circuit 903 is formed using a CMOS circuit in which an n-channel TFT 913 and a p-channel TFT 914 are combined.

The TFTs (including those indicated by reference numerals 911, 913, and 914) may be manufactured in accordance with Embodiment 1 above.

The pixel electrode 912 functions as an anode of an EL element. Further, banks 915 are formed at both edges of the pixel electrode 912, and an EL layer 916 and an EL element cathode 917 are formed on the pixel electrode 912.

An EL layer (a layer for emitting light and for carrier mobility in order to emit light) in which a light emitting layer, an electric charge transporting layer, and an electric charge injecting layer are freely combined may be formed as the EL layer 916. For example, low molecular weight EL materials or high molecular weight EL materials may be used. Furthermore, thin films made from a light emitting material that emits light by singlet excitation (fluorescence) (singlet compound), or a thin film made from a light emitting material that emits light by triplet excitation (phosphorescence) (triplet compound) can be used. It is also possible to use inorganic materials such as silicon carbide to form the charge transporting layers or the charge injecting layers. Known materials can be used for these organic EL materials and inorganic materials.

The cathode 917 functions as a common wiring for all pixels, and is electrically connected to the FPC 909 via a connection wiring 908. In addition, elements contained in the pixel portion 902 and the gate side driver circuit 903 are all covered with the cathode 917, the sealing material 918, and the protective film 919.

Note that it is preferable to use a material which is as transparent or semi-transparent as possible with respect to visible light, as the sealing material 918. Further, it is also preferable that the sealing material 918 be a material that allows as little moisture and oxygen as possible to pass therethrough.

It is preferable to, at least, form the protective film 919 made from a material such as a DLC film on a surface (exposed surface) of the sealing material 918 after completely enclosing the light emitting elements using the sealing material 918. The protective film may also be formed over the entire surface of the substrate, including the back surface. It is necessary to take care here such that the protective film is not formed in portions at which the external input terminal (FPC) is formed. A mask may be used so that the protective film is not formed in these portions, or the external input terminal portions may be covered with tape, such as Teflon tape, used as a masking tape in a CVD apparatus.

The EL elements can be completely shut off from the outside by thus enclosing the EL elements using the sealing material 918 and the protective film, so that the incursion of substances such as moisture and oxygen from the outside which promote deterioration of the EL layer by inducing oxidation thereof can be prevented. A light emitting device having high reliability can therefore be obtained.

Figure 10:
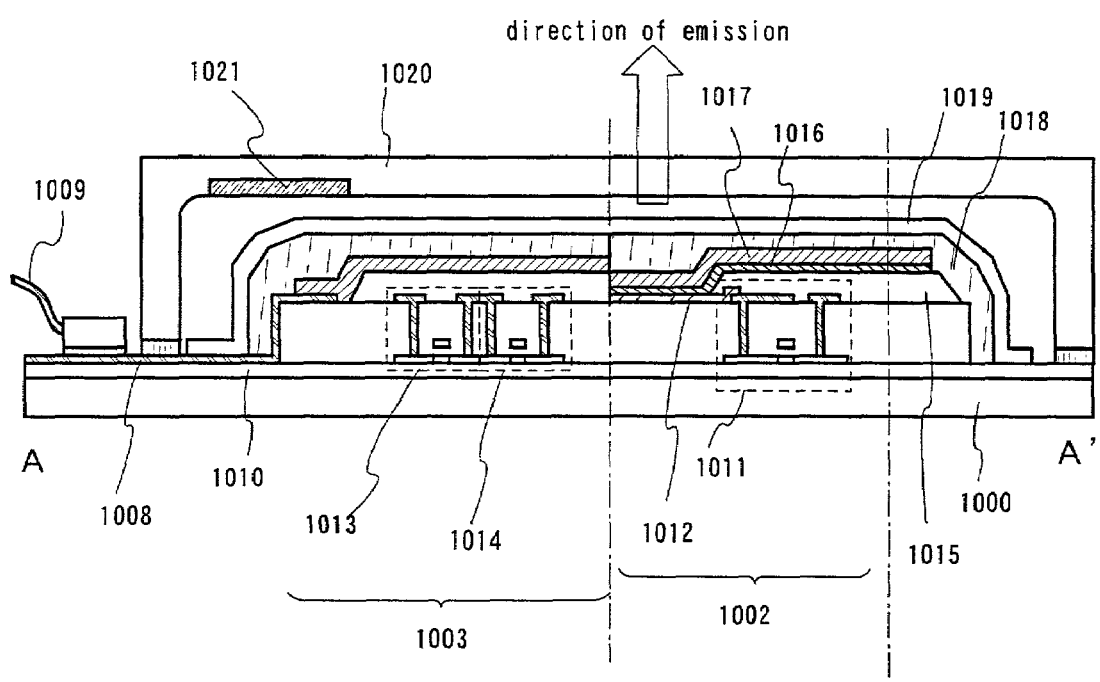
FIG. 10 is a cross sectional diagram showing an EL module.

A structure in which the pixel electrode is used as the cathode, and the EL layer and the anode are laminated may also be used. In this case light is emitted in a direction opposite that of FIGS. 9A and 9B. One example of such a structure is shown in FIG. 10. Note that an upper surface diagram is identical to that of FIG. 9A, and it is therefore omitted.

The cross sectional structure shown in FIG. 10 is explained below. In addition to a glass substrate or a quartz substrate, a semiconductor substrate or a metallic substrate can also be used as a substrate 1000. An insulating film 1010 is formed on the substrate 1000, and a pixel portion 1002 and a gate side driver circuit 1003 are formed on the insulating film 1010. The pixel portion 1002 is formed by a plurality of pixels containing an electric current control TFT 1011 and a pixel electrode 1012 which is electrically connected to a drain of the electric current control TFT 1011. The gate side driver circuit 1003 is formed using a CMOS circuit in which an n-channel TFT 1013 and a p-channel TFT 1014 are combined.

The pixel electrode 1012 functions as a cathode of the EL element. Further, banks 1015 are formed at both edges of the pixel electrode 1012, and an EL layer 1016 and an EL element anode 1017 are formed on the pixel electrode 1012.

The anode 1017 functions as a common wiring for all pixels, and is electrically connected to an FPC 1009 via a connection wiring 1008. In addition, all elements contained in the pixel portion 1002 and the gate side driver circuit 1003 are covered with a sealing material 1018 and by a protective film 1019 made from a material such as DLC. The covering material 1020 and the substrate 1000 are joined by an adhesive. Further, a convex portion is formed in the covering material, and a drying agent 1021 is disposed in the convex portion.

Note that it is preferable to use a material which is as transparent or semi-transparent as possible with respect to visible light, as the sealing material 1018. Further, it is also preferable that the sealing material 1018 be a material which allows as little moisture and oxygen as possible to pass therethrough.

The pixel electrode is used as the cathode, and the EL layer and the anode are laminated on top in FIG. 10. Thus, the direction of light emitted becomes the direction of the arrow shown in FIG. 10.

Note that it is possible to combine Embodiment 5 with any one of Embodiments 1 to 4.

Embodiment 6

Figure 11:
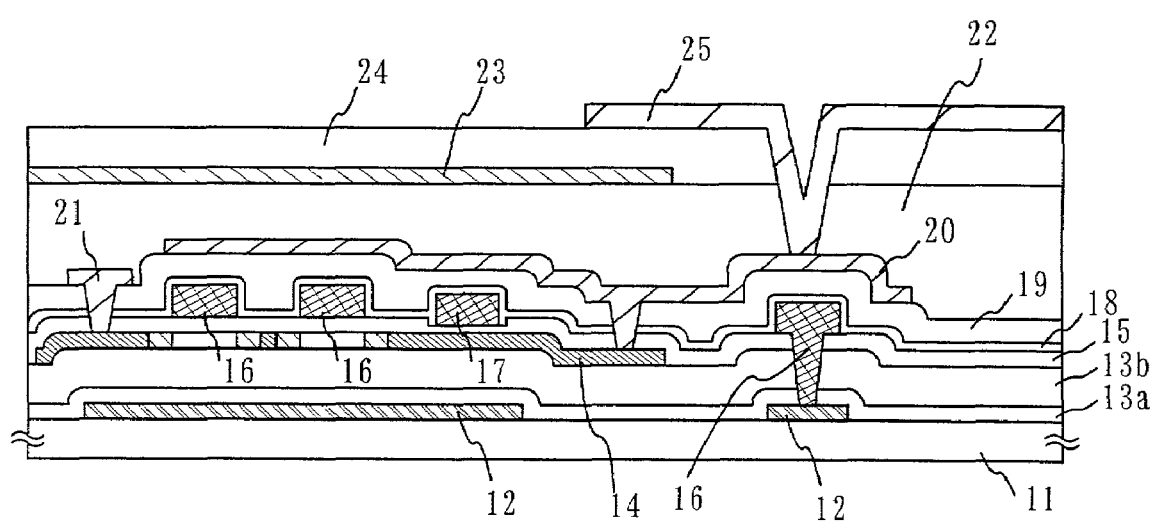
FIG. 11 is a cross sectional diagram of an active matrix substrate.

This embodiment shows an example different from Embodiment 1 with reference of FIG. 11.

First, a conductive film is formed on a substrate 11 having an insulating surface, followed by patterning, whereby scanning lines 12 are formed. The scanning lines 12 function as light blocking layers for protecting an active layer to be formed from light. Herein, a quartz substrate was used as the substrate 11, and a layered structure of a polysilicon film (thickness: 50 nm) and a tungsten silicide (W—Si) film (thickness: 100 nm) were used as the scanning lines 12. The polysilicon film protects the substrate 11 from contamination due to tungsten silicide.

Then, insulating films 13a and 13b covering the scanning electrodes 12 are formed to a thickness of 100 to 1000 nm (typically, 300 to 500 nm). Herein, a silicon oxide film (thickness: 100 nm) formed by CVD and a silicon oxide film (thickness: 280 nm) formed by LPCVD were stacked.

An amorphous semiconductor film was formed to a thickness of 10 to 100 nm. Herein, an amorphous silicon film (thickness: 69 nm) was formed by LPCVD. Then, crystallization, gettering, and patterning were conducted using the technique described in Embodiment modes 1 or 2 as a technique of crystallizing the amorphous semiconductor film to remove unnecessary portions of a crystalline silicon film, whereby a semiconductor layer 14 is formed.

Then, in order to form a storage capacitor, a mask is formed, and a part (region where a storage capacitor is to be formed) of the semiconductor layer 14 is doped with phosphorus.

Then, the mask is removed, and an insulating film covering the semiconductor layer 14 is formed. Thereafter, the mask is formed, and the insulating film on the region where a storage capacitor is to be formed is selectively removed.

The mask is removed and thermal oxidation is conducted, whereby an insulating film (gate insulating film) 15 is formed. Due to the thermal oxidation, the final thickness of the gate insulating film 15 became 80 nm. An insulating film thinner than that of the other region was formed on the region where a storage capacitor is to be formed.

Then, channel doping for adding a p-type or n-type impurity element to regions to be channel regions of TFTs in a low concentration was conducted over the entire surface or selectively. The purpose for this channel doping is to control a threshold voltage of a TFT. Herein, boron was added by ion doping in which diborane ($B_2H_6$) was excited with plasma without mass separation. Needless to say, ion implantation (in which mass separation is conducted) may be used.

Next, a mask is formed on the insulating film 15, and the insulating films 13a, 13b, and a contact hole reaching the scanning line 12 is formed. After formation of the contact hole, the mask is removed.

A conductive film is formed, followed by patterning, whereby gate electrodes 16 and capacitive wiring 17 are formed. Herein, a layered structure of a silicon film (thickness: 150 nm) doped with phosphorus and tungsten silicide (thickness: 150 nm) was used. The storage capacitor is composed of the insulating film 15 as a dielectric, the capacitive wiring 17, and a part of the semiconductor layer.

Phosphorus is added in a low concentration in a self-alignment manner, using the gate electrode 16 and the capacitive wiring 17 as a mask. The concentration of phosphorus in regions where phosphorus is added in a low concentration is regulated to be $1 \times 10^{16}$ to $5 \times 10^{18}$ atoms/cm$^3$, typically $3 \times 10^{17}$ to $3 \times 10^{18}$ atoms/cm$^3$.

Then, a mask is formed, and phosphorus is added in a high concentration, whereby high concentration impurity regions to be a source region or a drain region are formed. The concentration of phosphorus in the high concentration impurity regions is regulated to $1 \times 10^{20}$ to $1 \times 10^{21}$ atoms/cm$^3$ (typically, $3 \times 10^{19}$ to $3 \times 10^{20}$/cm$^3$). Regions of the semiconductor layer 14 overlapping the gate electrodes 16 become channel formation regions, and regions covered with the mask become low concentration impurity regions that function as LDD regions. After addition of the impurity element, the mask is removed.

Then, in order to form a p-channel TFT used in a driver circuit to be formed on the same substrate as that of pixels, a region to be an n-channel TFT is covered with a mask, and boron is added to form a source region or a drain region.

After the mask is removed, a passivation film 18 covering the gate electrode 16 and the capacitive wiring 17 is formed. Herein, a silicon oxide film was formed to a thickness of 70 nm. Then, the n-type or p-type impurity elements added in the respective concentrations in the semiconductor layer are activated by heat treatment or irradiation with strong light. Herein, activation was conducted by irradiation with a YAG laser from the reverse surface. An excimer laser may be used, in place of a YAG laser.

Then, an interlayer insulating film 19 made of an organic resin material is formed. Herein, an acrylic resin film having a thickness of 400 nm was used. Then, a contact hole reaching the semiconductor layer is formed, and an electrode 20 and a source wiring 21 are formed. In this embodiment, the electrode 20 and the source wiring 21 were composed of a three layered structure formed by continuously forming a Ti film (thickness: 100 nm), an aluminum film containing Ti (thickness: 300 nm), and a Ti film (thickness: 150 nm) by sputtering.

After hydrogenation is conducted, an interlayer insulating film 22 made of acrylic resin is formed. Then, a conductive film (thickness: 100 nm) having light transparency is formed on the interlayer insulating film 22, whereby a light shielding layer 23 is formed. Then, an interlayer insulating film 24 is formed. A contact hole reaching the electrode 20 is formed. Then, a transparent conductive film (herein, indium tin oxide (ITO) film) having a thickness of 100 nm is formed, followed by patterning, to obtain a pixel electrode 25.

It should be understood that this embodiment is described merely for an illustrative purpose, and the present invention is not limited to the processes of the present example. For example, as each conductive film, an element selected from tantalum (Ta), titanium (Ti), molybdenum (Mo), tungsten (W), chromium (Cr), and silicon (Si), or an alloy film (typically a Mo—W alloy, a Mo—Ta alloy) obtained by combining the elements can be used. Furthermore, as each insulating film, a silicon oxide film, a silicon nitride film, a silicon oxynitride film, and a film made of an organic resin material (polyimide, acrylic resin, polyamide, polyimideamide, benzocyclobutene (BCB) or the like) can be used.

This embodiment can be combined with either one of Embodiments 1 to 5.

Embodiment 7

In Embodiment 1, a top gate type TFT has been exemplified. The present invention is also applicable to a bottom gate type TFT shown in FIGS. 12A and 12B.

Figure 12A:
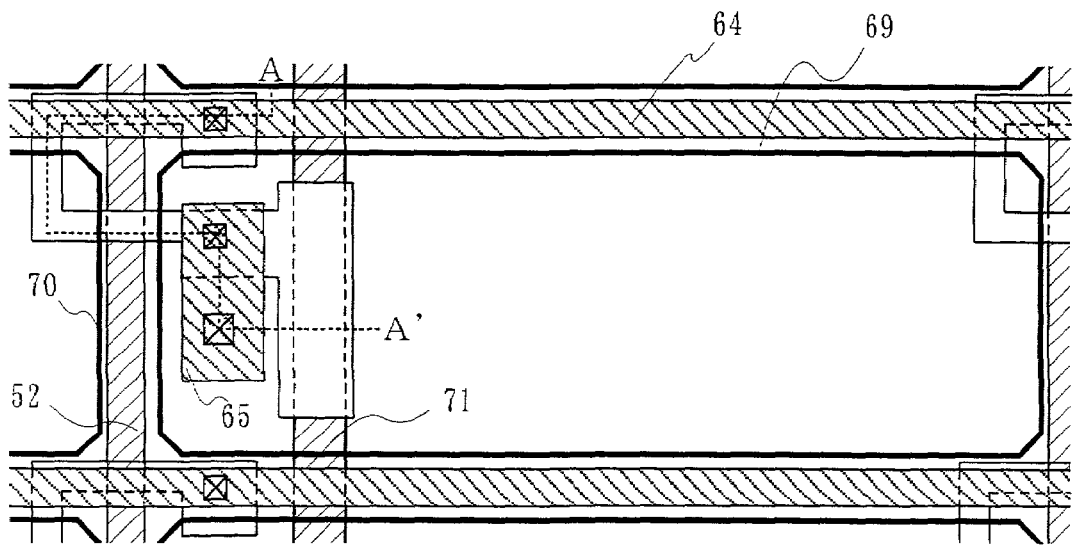
FIGS. 12A and 12B are a cross sectional diagram and an upper surface diagram, respectively, of an active matrix substrate.

FIG. 12A is a top view showing an enlarged pixel in a pixel portion. In FIG. 12A, a portion taken along a dotted line A-A' corresponds to a cross-sectional structure of the pixel portion in FIG. 12B.

Figure 12B:
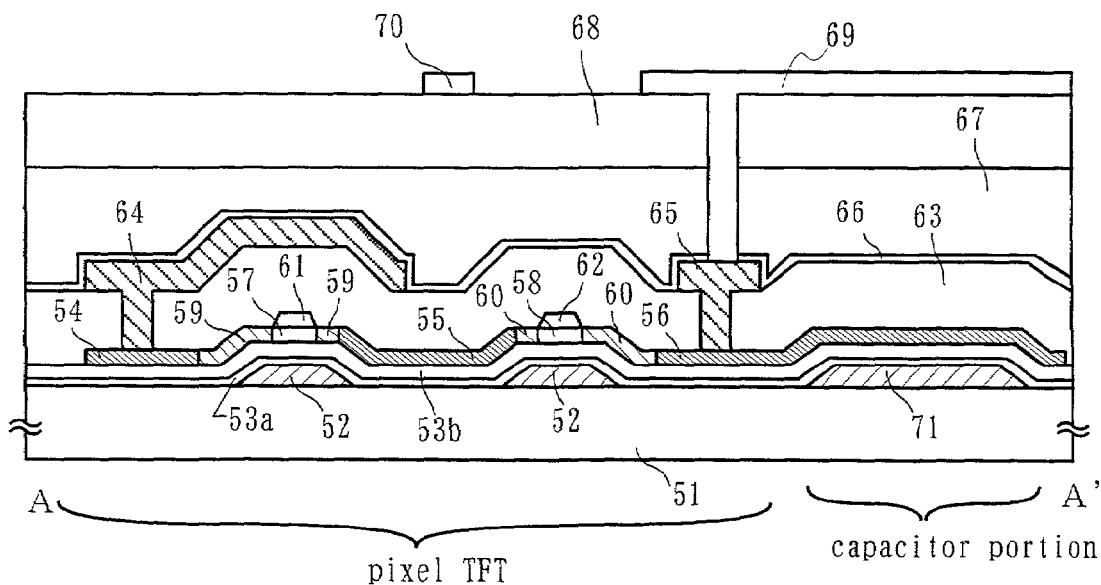

In the pixel portion shown in FIGS. 12A and 12B, a pixel TFT portion is composed of an n-channel TFT. Gate electrodes 52 are formed on a substrate 51, and a first insulating film 53a made of silicon nitride and a second insulating film 53b made of silicon oxide are provided. On the second insulating film 53b, source regions or drain regions 54 to 56 as an active layer, channel formation regions 57 and 58, and LDD regions 59 and 60 between the source region or drain region and the channel formation region are formed. The channel formation regions 57 and 58 are protected by insulating layers 61 and 62. After contact holes are formed in the first interlayer insulating film 63 covering the insulating layers 61, 62, and the active layer, a wiring 64 is connected to the source region 54 and a wiring 65 is connected to the drain region 56. A passivation film 66 is formed on the first interlayer insulating film 63. A second interlayer insulating film 67 is further formed on the passivation film 66. Furthermore, a third interlayer insulating film 68 is formed on the second interlayer insulating film 67. A pixel electrode 69 made of a transparent conductive film made of ITO, SnO$_2$ or the like is connected to the wiring 65. Reference numeral 70 denotes a pixel electrode adjacent to the pixel electrode 69.

In this embodiment, an active layer is formed in accordance with Embodiment modes 1 or 2.

In this embodiment, a channel stop type bottom gate type TFT has been described as an example. However, the present invention is not particularly limited thereto.

In this embodiment, a gate wiring of a pixel TFT in the pixel portion has a double gate structure. However, in order to reduce variation in an OFF current, a multi gate structure such as a triple gate structure may be used. Furthermore, in order to enhance an opening ratio, a single gate structure may be used.

Furthermore, a capacitor part of the pixel portion is composed of the first and second insulating films as a dielectric, capacitive wiring 71, and the drain region 56.

The pixel portion shown in FIGS. 12A and 12B is an example, and the pixel portion is not particularly limited to the above-mentioned configuration.

This embodiment can be combined with either one of Embodiments 1 to 4.

Embodiment 8

The driver circuit portion and the pixel portion fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 13A-13F, 14A-14D and 15A-15C.

FIG. 13A is a personal computer which comprises: a main body 2001; an image input section 2002; a display section 2003; and a key board 2004. The present invention can be applied to the display section 2003.

FIG. 13B is a video camera which comprises: a main body 2101; a display section 2102; a voice input section 2103; operation switches 2104; a battery 2105 and an image receiving section 2106. The present invention can be applied to the display section 2102.

FIG. 13C is a mobile computer which comprises: a main body 2201; a camera section 2202; an image receiving section 2203; operation switches 2204 and a display section 2205. The present invention can be applied to the display section 2205.

FIG. 13D is a goggle type display which comprises: a main body 2301; a display section 2302; and an arm section 2303. The present invention can be applied to the display section 2302.

FIG. 13E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet. The present invention can be applied to the display section 2402.

FIG. 13F is a digital camera which comprises: a main body 2501; a display section 2502; a view finder 2503; operation switches 2504; and an image receiving section (not shown in the figure). The present invention can be applied to the display section 2502.

Figure 14A:
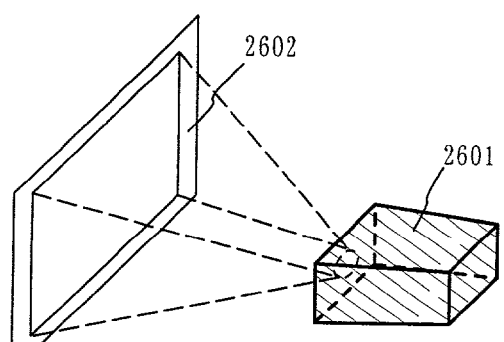
FIGS. 14A to 14D are diagrams showing examples of electronic equipment.

FIG. 14A is a front type projector which comprises: a projection system 2601; and a screen 2602. The present invention can be applied to the liquid crystal module 2808 which forms a part of the projection system 2601 to complete the whole system.

Figure 14B:
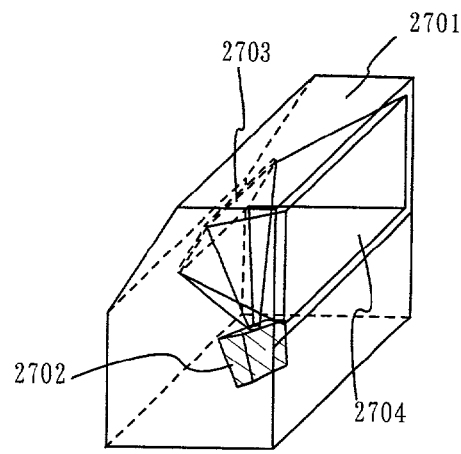

FIG. 14B is a rear type projector which comprises: a main body 2701; a projection system 2702; a mirror 2703; and a screen 2704. The present invention can be applied to the liquid crystal module 2808 which forms a part of the projection system 2702 to complete the whole system.

Figure 14C:
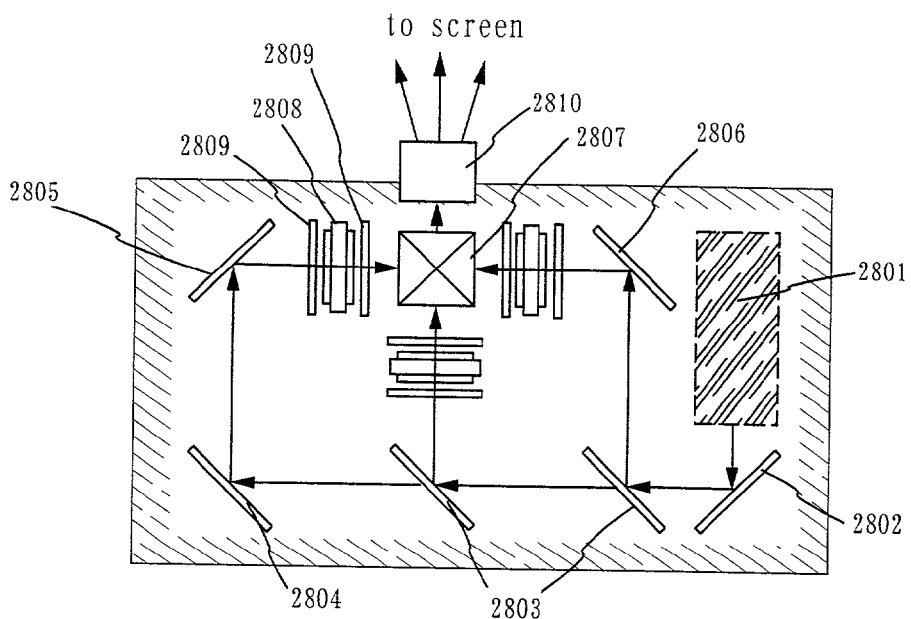

FIG. 14C is a diagram which shows an example of the structure of a projection system 2601 and 2702 in FIGS. 14A and 14B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 14C.

Figure 14D:
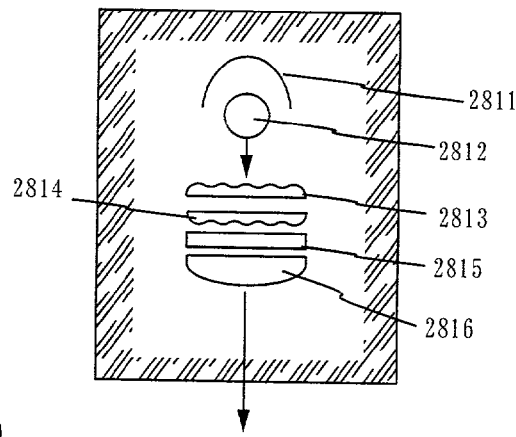

FIG. 14D is a diagram showing an example of a structure of an optical light source system 2801 in FIG. 14C. In this embodiment the optical light source system 2801 comprises: a reflector 2811; a light source 2812; lens arrays 2813 and 2814; a polarizer conversion element 2815; and a collimator lens 2816. Note that the optical light source system shown in FIG. 14D is merely an example and the structure is not limited to this example. For instance, an operator may appropriately dispose an optical lens, a film which has a function to polarize light, a film which adjusts a phase difference or an IR film, etc.

Note that the projectors shown FIGS. 14A-14D are the cases of using a transmission type electro-optical devices, and applicable examples of a reflection type electro-optical device and an EL module are not shown.

Figure 15A:
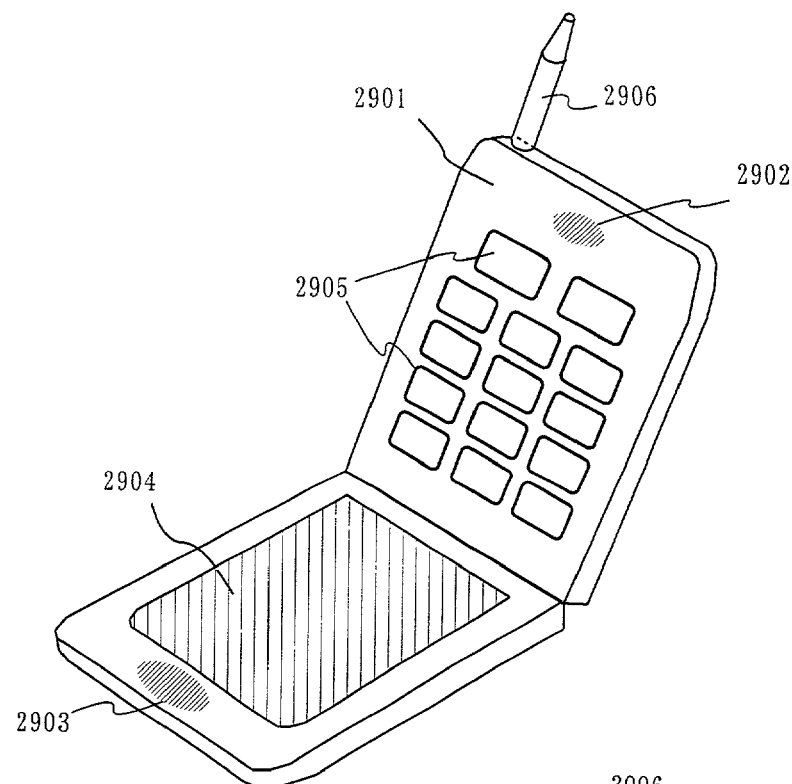
FIGS. 15A to 15C are diagrams showing examples of electronic equipment.

FIG. 15A is a mobile phone which comprises: a main body 2901; a voice output section 2902; a voice input section 2903; a display section 2904; operation switches 2905; an antenna 2906; and an image input section (CCD, image sensor, etc.) 2907 etc. The present invention can be applied to the display section 2904.

Figure 15B:
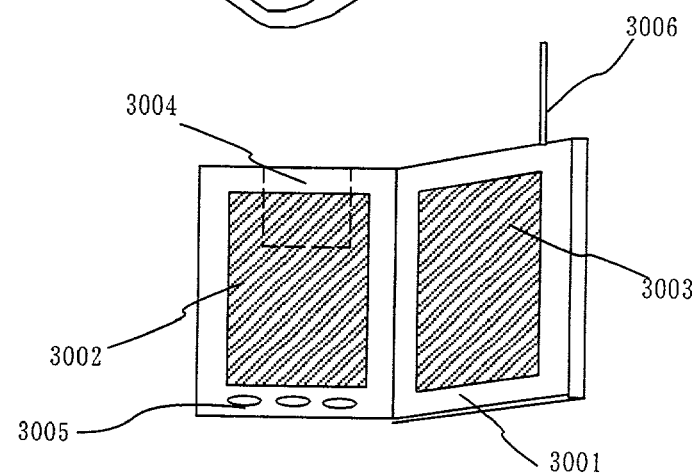

FIG. 15B is a portable book (electronic book) which comprises: a main body 3001; display sections 3002 and 3003; a recording medium 3004; operation switches 3005 and an antenna 3006 etc. The present invention can be applied to the display sections 3002 and 3003.

Figure 15C:
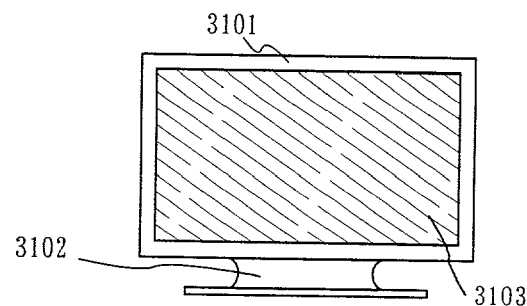
Figure 16:
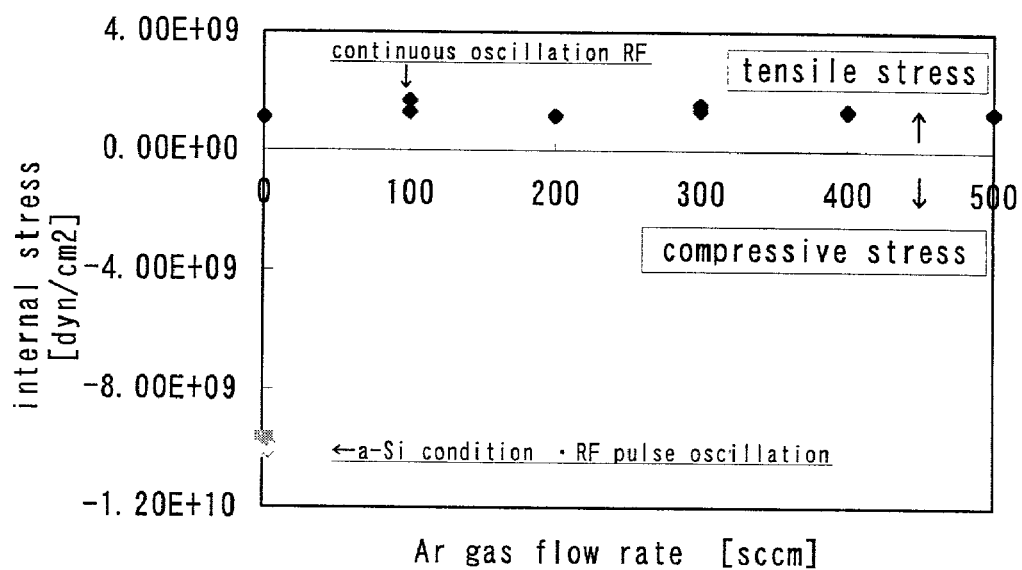
FIG. 16 is a graph showing a relationship between argon gas flow rate and an internal stress of a film.

FIG. 15C is a display which comprises: a main body 3101; a supporting section 3102; and a display section 3103 etc. The present invention can be applied to the display section 3103.

As described above, the applicable range of the present invention is very large, and the invention can be applied to electronic apparatuses of various areas. Note that the electronic devices of this embodiment can be achieved by utilizing any combination of constitutions in Embodiments 1 to 7.

By using the present invention, the number of high temperature (equal to or greater than 600° C.) heat treatment process steps can be reduced and lower temperature (equal to or less than 600° C.) processes can be realized. In addition, process steps can be simplified, and an increase in throughput can be achieved.

Furthermore, a high concentration of a noble (rare) gas element can be added to a semiconductor film at a reduced processing time on the order of 1 or 2 minutes, and therefore the throughput can be increased remarkably compared to gettering using phosphorous.

Further, a gettering ability of the present invention using a noble (rare) gas element is high compared to gettering using phosphorous, and in addition, a noble (rare) gas element can be added at a high concentration, for example from $1\times10^{20}$ to $5\times10^{21}/cm^3$, and therefore the amount of a metallic element added for use in crystallization can be increased. In other words, it becomes possible to perform crystallization processing at a shorter processing time by increasing the addition amount of the metallic element used in the crystallization. Furthermore, even if the length of crystallization processing time is not changed, crystallization can be performed at a lower temperature by increasing the addition amount of the metallic element used in the crystallization. In addition, spontaneous nucleation can be reduced, and a semiconductor film having a good crystallinity can be formed by increasing the addition amount of the metallic element used in the crystallization.

What is claimed is:

1. A method of manufacturing a semiconductor device comprising the steps of:
    adding a metallic element to a first semiconductor film having an amorphous structure;
    crystallizing the first semiconductor film to form a first semiconductor film having a crystalline structure;
    forming a barrier layer on a surface of the first semiconductor film having a crystalline structure;
    forming a second semiconductor film on the barrier layer;
    adding a noble gas element to a region of the second semiconductor film;
    gettering the metallic element into the region of the second semiconductor film to remove or reduce the amount of the metallic element within the first semiconductor film having a crystalline structure; and
    removing the second semiconductor film.

2. A method of manufacturing a semiconductor device according to claim 1, further comprising a step of adding one element or a plurality of elements chosen from the group consisting of O, $O_2$, P, H, and $H_2$ in addition to the noble gas element.

3. A method of manufacturing a semiconductor device according to claim 1, wherein the second semiconductor film is a semiconductor film having an amorphous structure or a crystalline structure.

4. A method of manufacturing a semiconductor device according to claim 1, wherein the metallic element is one element or a plurality of elements chosen from the group consisting of Fe, Ni, Go, Ru, Rh, Pd, Os, Ir, Pt, Cu, and Au.

5. A method of manufacturing a semiconductor device according to claim 1, wherein the step of crystallizing the first semiconductor film is a heat treatment process.

6. A method of manufacturing a semiconductor device according to claim 1, wherein the step of crystallizing the first semiconductor film is a process of irradiating strong light to the semiconductor film having an amorphous structure.

7. A method of manufacturing a semiconductor device according to claim 6, wherein the strong light is light emitted from a halogen lamp, a metal halide lamp, a xenon arc lamp, a carbon arc lamp, a high pressure sodium lamp, or a high pressure mercury lamp.

8. A method of manufacturing a semiconductor device according to claim 1, wherein the step of crystallizing the first semiconductor film is a heat treatment process and a process of irradiating strong light to the semiconductor film having an amorphous structure.

9. A method of manufacturing a semiconductor device according to claim 8, wherein the strong light is light emitted from a halogen lamp, a metal halide lamp, a xenon arc lamp, a carbon arc lamp, a high pressure sodium lamp, or a high pressure mercury lamp.

10. A method of manufacturing a semiconductor device according to claim 1, wherein the step of forming the barrier layer is a step of oxidizing a surface of the semiconductor film having a crystalline structure by using a solution containing ozone.

11. A method of manufacturing a semiconductor device according to claim 1, wherein the step of forming the barrier layer is a step of oxidizing a surface of the semiconductor film having a crystalline structure by irradiating ultraviolet light.

12. A method of manufacturing a semiconductor device according to claim 1, wherein the step of gettering is a heat treatment process.

13. A method of manufacturing a semiconductor device according to claim 1, wherein the step of gettering is a process of irradiating strong light to the semiconductor film.

14. A method of manufacturing a semiconductor device according to claim 13, wherein the strong light is light emitted from a halogen lamp, a metal halide lamp, a xenon arc lamp, a carbon arc lamp, a high pressure sodium lamp, or a high pressure mercury lamp.

15. A method of manufacturing a semiconductor device according to claim 1, wherein the step of gettering is a heat treatment process and a process of irradiating strong light to the semiconductor film.

16. A method of manufacturing a semiconductor device according to claim 15, wherein the strong light is light emitted from a halogen lamp, a metal halide lamp, a xenon arc lamp, a carbon arc lamp, a high pressure sodium lamp, or a high pressure mercury lamp.

17. A method of manufacturing a semiconductor device according to claim 1, wherein the noble gas element is one element or a plurality of elements chosen from the group consisting of He, Ne, Ar, Kr, and Xe.

18. A method of manufacturing a semiconductor device according to claim 1, wherein the second semiconductor film further comprises one element or a plurality of elements selected from the group consisting of O, $O_2$, P, H, and $H_2$.

19. A method of manufacturing a semiconductor device according to claim 1, wherein the metallic element moves to the region of the second semiconductor film in a direction perpendicular to the first semiconductor film.

20. A method of manufacturing a semiconductor device comprising:
    forming a first semiconductor film having an amorphous structure over a substrate;
    providing the first semiconductor film with a material for promoting crystallization;
    heating the first semiconductor film for crystallizing;
    irradiating the first semiconductor film with a laser light for improving crystallinity;
    forming a barrier layer over the first semiconductor film having a crystalline structure;
    forming a second semiconductor film over the barrier layer;
    adding a noble gas element to a region of the second semiconductor film;
    gettering the material for promoting crystallization into the region of the second semiconductor film.

21. A method of manufacturing a semiconductor device according to claim 20, wherein the barrier layer is formed by oxidizing a surface of the first semiconductor film by using a solution containing ozone.

22. A method of manufacturing a semiconductor device according to claim 20, wherein the barrier layer is formed by oxidizing a surface of the first semiconductor film by irradiating ultraviolet light.

23. A method of manufacturing a semiconductor device according to claim 20, wherein the noble gas element is at least an element selected from the group consisting of He, Ne, Ar, Kr and Xe.

24. A method of manufacturing a semiconductor device according to claim 20, wherein the semiconductor device is applied to an electronic apparatus selected from the group consisting of a personal computer, a video camera, a mobile computer, a goggle type display, a DVD player, a digital camera, a front type projector, a rear type projector, a mobile phone and an electronic book.

25. A method of manufacturing a semiconductor device according to claim 20, wherein the metallic element moves to the region of the second semiconductor film in a direction perpendicular to the substrate.

26. A method of manufacturing a semiconductor device comprising:
    forming a first semiconductor film having an amorphous structure over a substrate;
    providing the first semiconductor film with a material for promoting crystallization;
    heating the first semiconductor film for crystallizing;
    irradiating the first semiconductor film with a laser light for improving crystallinity;
    forming a second semiconductor film over the first semiconductor film, the second semiconductor film comprising a noble gas element;
    gettering the material for promoting crystallization into the second semiconductor film.

27. A method of manufacturing a semiconductor device according to claim 26, wherein the noble gas element is at least an element selected from the group consisting of He, Ne, Ar, Kr and Xe.

28. A method of manufacturing a semiconductor device according to claim 26, wherein the semiconductor device is applied to an electronic apparatus selected from the group consisting of a personal computer, a video camera, a mobile computer, a goggle type display, a DVD player, a digital camera, a front type projector, a rear type projector, a mobile phone and an electronic book.

29. A method of manufacturing a semiconductor device according to claim 26, wherein the metallic element moves to the second semiconductor film in a direction perpendicular to the substrate.

30. A method of manufacturing a semiconductor device comprising:
    providing a crystalline semiconductor film comprising silicon over a substrate, said crystalline semiconductor film containing a metallic element;
    forming a barrier layer over the crystalline semiconductor film;

forming a semiconductor film over the barrier layer;

adding a noble gas element to a region of the second semiconductor film;

gettering the metallic element into the region of the semiconductor film to remove or reduce the amount of the metallic element within the crystalline semiconductor film; and removing the semiconductor film.

31. A method of manufacturing a semiconductor device according to claim 30, wherein the barrier layer is formed by oxidizing a surface of the first semiconductor film by using a solution containing ozone.

32. A method of manufacturing a semiconductor device according to claim 30, wherein the barrier layer is formed by oxidizing a surface of the first semiconductor film by irradiating ultraviolet light.

33. A method of manufacturing a semiconductor device according to claim 30, wherein the noble gas element is at least an element selected from the group consisting of He, Ne, Ar, Kr and Xe.

34. A method of manufacturing a semiconductor device according to claim 30, wherein the semiconductor device is applied to an electronic apparatus selected from the group consisting of a personal computer, a video camera, a mobile computer, a goggle type display, a DVD player, a digital camera, a front type projector, a rear type projector, a mobile phone and an electronic book.

35. A method of manufacturing a semiconductor device according to claim 30, wherein the metallic element moves to the region of the semiconductor film in a direction perpendicular to the substrate.

36. A method of manufacturing a semiconductor device comprising the steps of:

providing a crystalline semiconductor film comprising silicon over a substrate, said crystalline semiconductor film containing a metallic element;

forming a semiconductor film over the crystalline semiconductor film;

adding a noble gas element to a region of the semiconductor film;

gettering the metallic element into the semiconductor film to remove or reduce the amount of the metallic element within the crystalline semiconductor film.

37. A method of manufacturing a semiconductor device according to claim 36, wherein the noble gas element is added into an upper surface of the semiconductor film.

38. A method of manufacturing a semiconductor device according to claim 36, wherein the semiconductor film comprises a first region and a second region comprising a noble gas element on the first region.

39. A method of manufacturing a semiconductor device according to claim 36, wherein the metallic element moves to the region of the semiconductor film in a direction perpendicular to the substrate.

* * * * *

UNITED STATES PATENT AND TRADEMARK OFFICE
CERTIFICATE OF CORRECTION

| | |
|---|---|
| PATENT NO. | : 7,316,947 B2 |
| APPLICATION NO. | : 10/072931 |
| DATED | : January 8, 2008 |
| INVENTOR(S) | : Shunpei Yamazaki et al. |

It is certified that error appears in the above-identified patent and that said Letters Patent is hereby corrected as shown below:

Column 2, line 56; column 8, line 14; column 9, line 6; and column 10, line 28; please replace "inert gas elements" with --noble (rare) gas elements--.

Column 9, line 50, please replace "an inert gas element" with --a noble (rare) gas element--.

Column 11, line 34, please replace "Gettering in then performed" with --Gettering is then performed--.

Signed and Sealed this

Twenty-fourth Day of June, 2008

JON W. DUDAS
*Director of the United States Patent and Trademark Office*